(12) United States Patent
Wimmer et al.

(10) Patent No.: US 10,753,988 B2
(45) Date of Patent: Aug. 25, 2020

(54) WIRELESS POSITION SENSOR ASSEMBLY FOR A ROTATING ACTUATOR

(71) Applicant: Nortek Security & Control LLC, Carlsbad, CA (US)

(72) Inventors: Jason Patrick Wimmer, Mollala, OR (US); Jason Alan Cane, Ridgefield, WA (US)

(73) Assignee: Nortek Security & Control LLC, Carlsbad, CA (US)

( * ) Notice: Subject to any disclaimer, the term of this patent is extended or adjusted under 35 U.S.C. 154(b) by 278 days.

(21) Appl. No.: 15/578,647

(22) PCT Filed: Jun. 2, 2016

(86) PCT No.: PCT/US2016/035555
§ 371 (c)(1),
(2) Date: Nov. 30, 2017

(87) PCT Pub. No.: WO2016/196819
PCT Pub. Date: Dec. 8, 2016

(65) Prior Publication Data
US 2020/0033423 A1    Jan. 30, 2020

Related U.S. Application Data

(60) Provisional application No. 62/170,082, filed on Jun. 2, 2015, provisional application No. 62/318,033, filed on Jun. 2, 2016.

(51) Int. Cl.
*G01R 33/02* (2006.01)
*G01R 33/00* (2006.01)

(52) U.S. Cl.
CPC ......... *G01R 33/02* (2013.01); *G01R 33/0005* (2013.01)

(58) Field of Classification Search
CPC .... G01R 33/02; G01R 33/0005; G01D 11/30; G01D 5/14; G05G 1/10; H01H 2239/006; H01H 2239/074; H01H 2219/0622
See application file for complete search history.

(56) References Cited

U.S. PATENT DOCUMENTS 4,199,741 A    4/1980 Serrus Pai et al.
4,446,455 A    5/1984 Nashawaty
(Continued)

FOREIGN PATENT DOCUMENTS

CN    202215818 U    5/2012
CN    203615374 A    5/2014
(Continued)

OTHER PUBLICATIONS

[Online]. (c) 2011 Ubiq Solutions. [archived on Apr. 21, 2016]. Retrieved from the Internet: <URL: https://web.archive.org/web/20160421170637/http://unnderbar.se/ubiqsolutions/smarthome.html, (2011), 5 pgs.

(Continued)

*Primary Examiner* — Thang X Le
(74) *Attorney, Agent, or Firm* — Schwegman Lundberg & Woessner, P.A.

(57) ABSTRACT

A device for wirelessly transmitting a rotation position of an actuator. The device comprises first and second housings. The housing configured for securing to a body of the actuator. An adaptive sleeve may be used for coupling the second housing to a stem of the actuator. The device includes a sensor and a sensor trigger that are mounted in different ones of the first and second housings. The sensor generates a sensor output signal based on a proximity of the sensor to the sensor trigger. The sensor and sensor trigger are mounted such that relative motion between the first and second housings produces a change in the sensor output signal. A radio transmitter transmits the rotational position of the actuator stem based on the sensor output signal.

21 Claims, 14 Drawing Sheets

(56) References Cited

U.S. PATENT DOCUMENTS

| | | | |
|---|---|---|---|
| 4,756,336 | A | 7/1988 | Amezcua |
| 5,518,028 | A | 5/1996 | Walker |
| 5,608,378 | A | 3/1997 | McLean et al. |
| 5,717,188 | A | 2/1998 | Vaillancourt |
| 6,294,994 | B1 | 9/2001 | Hoellerich |
| 6,314,994 | B1 * | 11/2001 | Listl ............... F16K 37/0041 137/552 |
| 6,733,146 | B1 | 5/2004 | Vastano |
| 7,002,109 | B2 | 2/2006 | Klask |
| 8,322,366 | B2 | 12/2012 | Sullivan |
| 8,919,375 | B2 * | 12/2014 | Duboy ............ F16K 37/0033 137/554 |
| 8,928,187 | B2 | 1/2015 | Hamm |
| 9,605,852 | B2 | 3/2017 | Porraro |
| 2006/0202848 | A1 | 9/2006 | Volodarsky |
| 2009/0064809 | A1 | 3/2009 | Miret et al. |
| 2011/0140908 | A1 | 6/2011 | Kosht et al. |
| 2013/0113465 | A1 | 5/2013 | Padilla |
| 2013/0206258 | A1 | 8/2013 | Duboy et al. |
| 2013/0220779 | A1 * | 8/2013 | Kerner ............... H01H 19/11 200/4 |
| 2013/0314239 | A1 * | 11/2013 | Clark ............... F16K 37/0041 340/686.6 |
| 2014/0208958 | A1 * | 7/2014 | Porraro ............... F24C 3/12 99/344 |
| 2014/0230661 | A1 | 8/2014 | Stilo et al. |
| 2015/0070002 | A1 | 3/2015 | Schott |
| 2015/0196161 | A1 | 7/2015 | Myllymaki |
| 2015/0339917 | A1 | 11/2015 | Messing et al. |
| 2016/0063837 | A1 | 3/2016 | Shao et al. |
| 2016/0247027 | A1 * | 8/2016 | Tsoi ............... H04N 5/2252 |
| 2018/0224306 | A1 | 8/2018 | Wimmer et al. |

FOREIGN PATENT DOCUMENTS

| | | |
|---|---|---|
| CN | 204213452 U | 3/2015 |
| CN | 204557140 U | 8/2015 |
| CN | 108027086 | 5/2018 |
| CN | 108027086 B | 11/2019 |
| EP | 2341270 A1 | 7/2011 |
| JP | 2015148356 A | 8/2015 |
| WO | WO-2016196819 | 12/2016 |
| WO | WO-2016196819 A3 | 12/2016 |

OTHER PUBLICATIONS

"Burner Alert", [online]. [retrieved May 31, 2016]. Retrieved from the Internet: https://burneralert.com/buyit/faqs/, 2 pgs.

"International Application Serial No. PCT/US2016/035555, International Search Report dated Nov. 22, 2016", 4 pgs.

"International Application Serial No. PCT/US2016/035555, Invitation to Pay Add'l Fees and Partial Search Report dated Sep. 23, 2016", 3 pgs.

"International Application Serial No. PCT/US2016/035555, Written Opinion dated Nov. 22, 2016", 8 pgs.

"Machnine Translation of CN2004557140U, published on Aug. 12, 2015", 6 pgs.

"International Application Serial No. PCT US2016 035555, International Preliminary Report on Patentability dated Dec. 14, 2017", 10 pgs.

"U.S. Appl. No. 15/945,253, Final Office Action dated Jan. 7, 2020", 6 pgs.

"U.S. Appl. No. 15/945,253, Non Final Office Action dated Jun. 25, 2019", 10 pgs.

"U.S. Appl. No. 15/945,253, Notice of Allowance dated Mar. 27, 2020", 8 pgs.

"U.S. Appl. No. 15/945,253, Response filed Mar. 10, 2020 to Final Office Action dated Jan. 7, 2020", 6 pgs.

"U.S. Appl. No. 15/945,253, Response filed Dec. 19, 2019 to Non Final Office Action dated Jun. 25, 2019", 9 pgs.

"Chinese Application Serial No. 201680038279.X, Office Action dated Jan. 30, 2019", w/ English Translation, 16 pgs.

"Chinese Application Serial No. 201680038279.X, Response filed Jun. 12, 2019 to Office Action dated Jan. 30, 2019", w/ English claims, 19 pgs.

"Chinese Application Serial No. 201680038279.X, Response filed Jul. 16, 2019 to Examiner Interview Summary dated Jul. 3, 2019", w/ English claims, 12 pgs.

* cited by examiner

WIRELESS POSITION SENSOR ASSEMBLY FOR A ROTATING ACTUATOR

CROSS-REFERENCE TO RELATED APPLICATIONS

This application is a U.S. National Stage Filing Under 35 U.S.C. § 371 of International Patent Application Serial No. PCT/US2016/035555, filed on Jun. 2, 2016, and published on Dec. 8, 2016, as WO 2016/196819 A2, which claims the benefit of U.S. Provisional Application No. 62/170,082, filed Jun. 2, 2015, and U.S. Provisional Application No. 62/318,033, filed Apr. 4, 2016, each of which are incorporated herein by reference.

TECHNICAL FIELD

The present disclosure relates generally to position sensors, and, more particularly, to wireless position sensors that attach to rotating actuators, such as switches or valves, for retrofitting existing rotating actuators.

BACKGROUND INFORMATION

Many appliances and other devices have manually operated actuators, such as switches and valves, used to control or otherwise operate the appliance. For instance, an actuator on a stove or range controls heating elements. Many stoves have wired actuator position sensors connected to a light that indicates whether a heating element of the stove is on or off. Accordingly, the operational state of the actuator or valve is usually readily apparent to a user observing the light.

DETAILED DESCRIPTION OF EMBODIMENTS

Figure 1A:
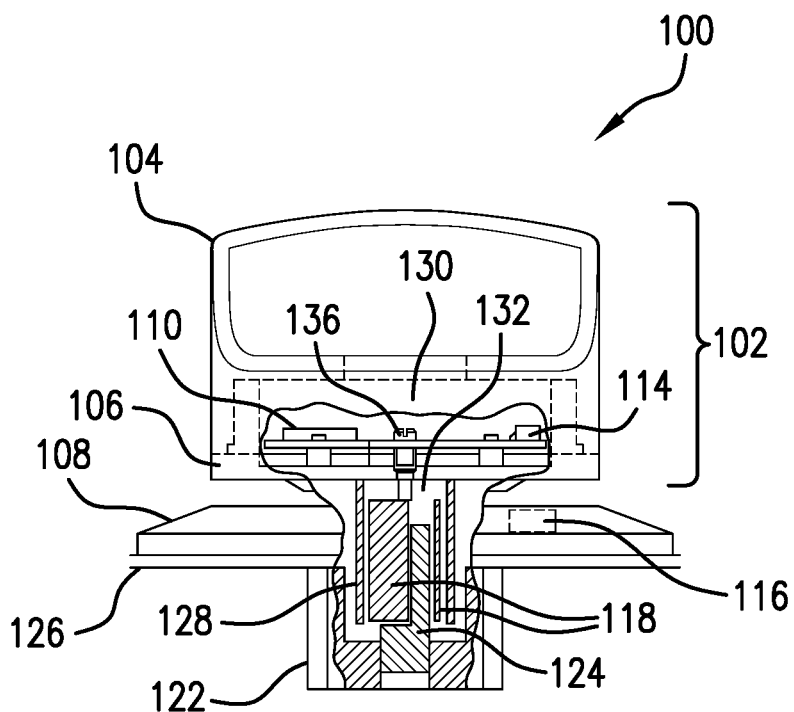
FIG. 1A is a side elevation view of a first embodiment wireless actuator position sensor assembly.

Before beginning a detailed description of the embodiments, mention of the following is in order. When appropriate, like reference materials and characters are used to designate identical, corresponding, or similar components in different figures. The figures associated with this disclosure typically are not drawn with dimensional accuracy to scale, i.e., such drawings have been drafted with a focus on clarity of viewing and understanding rather than dimensional accuracy.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Use of directional terms such as "upper," "lower," "above," "below", "in front of," "behind," etc. are intended to describe the positions or orientations of various components relative to one another as shown in the various figures and are not intended to impose limitations on any position or orientation of any embodiment relative to any reference point external to the reference.

It will, of course, be understood that modifications of the embodiments, in various aspects, will be apparent to skilled persons, some being apparent only after study, others being matters of routine mechanical, chemical and electronic design. No single feature, function or property of the exemplary embodiment(s) is essential. Other embodiments are possible, their specific designs depending upon the particular application. Skilled persons will recognize that numerous modifications and changes may be made to the embodiment(s) without departing from the scope of the claimed invention. As such, the scope of the invention should not be limited by the particular embodiments herein described but should be defined only by the appended claims and equivalents thereof.

Overview

It is often useful to know the operational state of an actuator when there is no one present to observe it. A wireless actuator position indicator allows remote indication of the rotational position of an actuator to a user or a control system remote from the appliance. The rotational position of a stem of the actuator is an amount of angular displacement of the stem about its longitudinal axis, relative to a body of the actuator. The rotational position of the actuator stem controls the operational state of the actuator; thus the operational state of the actuator can be inferred from the rotational position of the actuator stem. Accordingly, the disclosed techniques provide—and may be used to quickly and easily retrofit—an actuator (e.g., on an appliance or other device) with a wireless position sensor that can be readily installed by a typical homeowner lacking specialized knowledge or tools.

Various embodiments of a wireless actuator position sensor assembly are described herein, each configured to wirelessly transmit information regarding the rotational position of a stem of an actuator to a remote station, such as a home computer, a home security system or a mobile phone. The various embodiments of the wireless actuator position sensor assembly may be used either as an Original Equipment Manufacturer (OEM) actuator knob or as a replacement for an OEM actuator knob or handle. The various embodiments of the wireless actuator position sensor assembly may be used, with the appropriate changes made, with any type of actuator having a stem that is rotated, including without limitation, valves and switches, on any type of device or appliance, including without limitation, stoves, ranges, BBQ grills, and washing machines.

The following description includes eight subsections, each of which corresponds to an illustrated embodiment. In general, however, each embodiment includes a rotatable assembly and a stationary component. More specifically, a rotatable assembly refers to a graspable adjustment mechanism such as a knob body, any optional (adaptive and trigger) sleeve devices, and any other optional components that mount to or are otherwise rotatable with an actuator stem of an actuator, whereas a stationary component refers to a faceplate, cover, or housing deployed in fixed relation to a body of the actuator.

First Embodiment

Figure 1B:
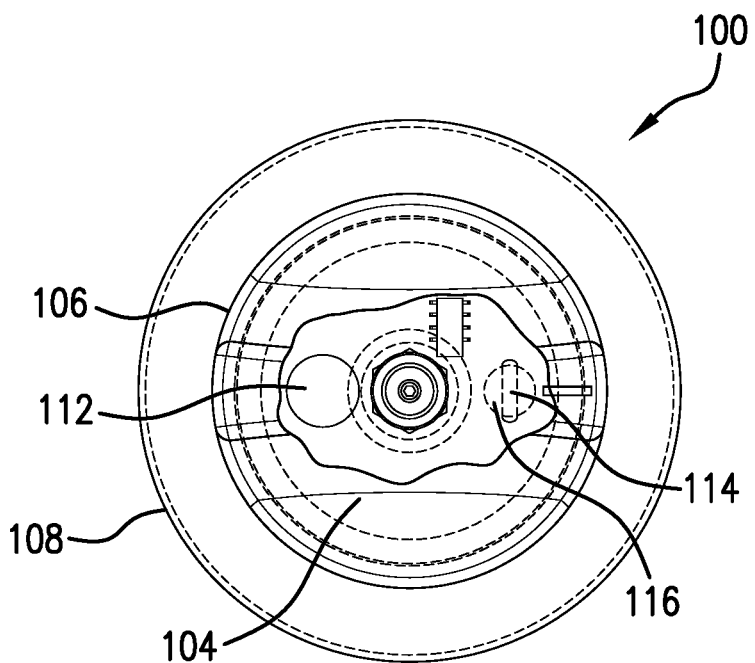
FIG. 1B is a top plan view of the first embodiment wireless actuator position sensor assembly.
Figure 1C:
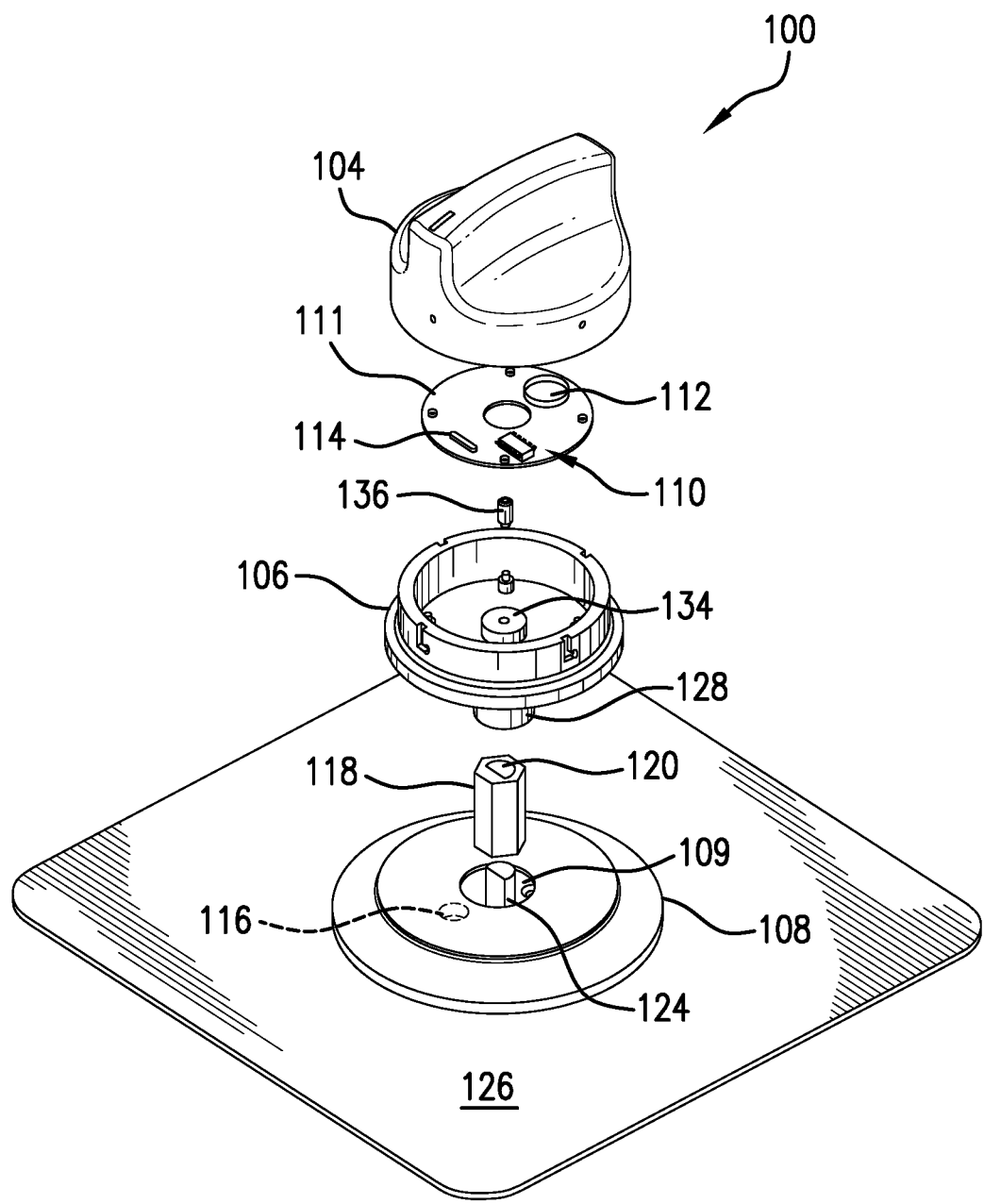
FIG. 1C is an exploded isometric view of the first embodiment wireless actuator position sensor assembly.

FIGS. 1A, 1B and 1C show a first embodiment of a wireless actuator position sensor assembly 100. The first embodiment wireless actuator position sensor assembly 100 is configured for coupling to an actuator with an actuator body 122 and an actuator stem 124. In the first embodiment, the actuator is coupled to an appliance surface 126 with the actuator body 122 below the appliance surface 126 and with the actuator stem 124 protruding above the appliance surface 126. Other embodiments of the wireless actuator position sensor assembly may be configured for use, with the appropriate changes made, for actuators with stems that do not protrude above the appliance surface, or for actuators that are mounted above a surface or elsewhere on an appliance or device. The first embodiment wireless actuator position sensor assembly 100 comprises a first housing 108, a second housing 102, electronic circuitry 110 (including a sensor 114), a sensor trigger 116, and an adaptive sleeve 118.

The first housing 108 house the sensor trigger 116. In the first embodiment, the first housing 108 has a shape of a thin annular cylinder, with the sides tapering inward toward a top of the first housing 108, but in other embodiments may have another suitable shape, such as a thin annular box. The sensor trigger 116 is positioned on or within the first housing 108 and coupled thereto such that when the first housing 108 is coupled, directly or indirectly, to the actuator body 122, the sensor trigger 116 is fixed laterally and rotationally relative to the actuator body 122. In the first embodiment, the sensor trigger 116 is a magnet, but in other embodiments it may be some other type of sensor trigger such as a Radio Frequency Identification (RFID) tag, a radiation source or a light source. In order to correctly indicate the rotational position of the actuator stem 124, the first housing 108 is configured for coupling to the actuator body 122 in a manner so that it is in a fixed relation with the actuator body 122 and cannot move laterally or rotationally relative to the actuator body 122. In the first embodiment 100, the first housing 108 is configured for coupling to the actuator body 122 indirectly, by coupling to the appliance surface 126, which in turn is coupled to the actuator body 122, typically with an adhesive, or by suction, welding or mechanical fastener such as screws. The first housing 108 has a first housing cavity (an opening) 109 configured for accepting insertion of the actuator stem 124 and the adaptive sleeve 118 over the actuator stem 124. In other embodiments, the first housing cavity 109 may be configured with a size and shape only large enough for an actuator stem to be inserted, the actuator stem inserting into an adaptive sleeve that does not insert into the first housing cavity 109. In the first embodiment, the first housing cavity 109 is located in the exact center of the first housing 108, but in other embodiments may be located off-center. The first housing 108 is typically made of injection molded plastic, but in some embodiments may be made by other suitable methods with other suitable materials.

The second housing 102 is typically shaped like a knob, typically similar to the OEM knob which it replaces. In some embodiments the second housing 102 may have an extending handle to increase leverage. The second housing 102 comprises a housing top 104, and a housing base 106. The housing base 106 has a base cavity 130 into which the electronic circuitry 110 is positioned. In the first embodiment, the housing base 106 and the housing top 104 are configured for detachably coupling with a mechanical locking mechanism. In other embodiments the housing base 106 and housing top 104 are configured for coupling in other ways, such as mechanical fasteners (e.g. screws), clips or adhesive. The housing base 106 has a base stem 128 protruding from the bottom of the housing base 106 with a base stem cavity 132 therein. The base stem cavity 132 has a bottom that is open and a top that is closed. The base stem cavity 132 is configured for the adaptive sleeve 118 to be inserted therein, so that when the adaptive sleeve 118 is inserted and the second housing 102 is rotated, the adaptive sleeve 118 rotates as well. In the first embodiment, the base stem cavity 132 has a shape and size similar to that of the adaptive sleeve 118. The adaptive sleeve 118 inserts into the base stem cavity 132 with a sliding fit or a location fit, but in other embodiments may have a looser or tighter fit. A looser fit will allow some play between the adaptive sleeve 118 and the second housing 102, which may not be desirable. A tighter fit may also be undesirable as it may interfere with height adjustment of the second housing 102. In the first embodiment, the base stem cavity 132 and the exterior of the adaptive sleeve 118 have hexagonal cross-sections, but may have different cross-sectional shapes in other embodiments. The base stem 128 is configured for insertion into the first housing cavity 109 with a fit at least as loose as a sliding fit, permitting the base stem 128 to rotate freely within the first housing cavity 109, though more typically, there is actual clearance between the base stem 128 and the first housing cavity 109. The housing top 104 and the housing base 106 are typically made of injection molded plastic, but in some embodiments may be made by other suitable methods with other suitable materials.

The electronic circuitry 110 includes a battery 112, the sensor 114 and other circuitry such as a radio frequency (RF) transmitter. In the first embodiment, the electronic circuitry 110 is attached to a circuit board 111. In other embodiments, the electronic circuitry 110 is not attached to a circuit board, but is mounted in some other way, such as directly attaching to the housing base 106. In other embodiments, the electronic circuitry 110 may have a different power source than a battery and the power source may be located off the circuit board 111 elsewhere in the second housing 102. For example, the first embodiment wireless actuator position sensor assembly 100 may have conductive or inductive contacts leading to an external power source. The circuit board 111 in the first embodiment comprises rigid materials, but in other embodiments may comprise flexible materials. The sensor 114 in the first embodiment is a magnetic-field detector, but in other embodiments may be some other type of sensor such as an RFID transmitter, a radiation detector, or a photo detector. The sensor 114 is configured for generating a signal based on the proximity of the sensor trigger 116 to the sensor 114. The RF transmitter and other components of electronic circuitry 110 are configured for transmitting information about the rotational position of the actuator stem 124 based on the signal from the sensor. In some embodiments, the electronic circuitry 110 also includes an RF receiver. The RF receiver may be configured for receiving commands or for receiving acknowledgements and other communications used to execute the communications protocol.

The adaptive sleeve 118 has a sleeve center cavity 120 configured for the actuator stem 124 of the actuator to be inserted therein. The adaptive sleeve 118 is configured such that when the actuator stem 124 is inserted, the actuator stem 124 rotates when the adaptive sleeve 118 is rotated. The sleeve center cavity 120 and the actuator stem 124 typically have a sliding fit or a location fit. In other embodiments the sleeve center cavity 120 may have a looser fit with the actuator stem 124, though this will allow some play which may not be desirable. The sleeve center cavity 120 in the first embodiment has a "D" shaped cross-section to match the "D" shape cross-section of the actuator stem 124. However, not all actuators will have an actuator stem with a "D" shaped cross-section, but will have actuator stems with other cross-sectional shapes such as square or hexagonal. Thus in other embodiments, the sleeve center cavity 120 will have a different cross-section, one selected for mating with a specific shape of actuator stem. In some embodiments, the first embodiment wireless position sensor actuator assembly 100 has multiple adaptive sleeves, each with a sleeve center cavity of a different shape, configured for different types of actuator stems. A user can select the appropriate adaptive sleeve to use, depending on the type of actuator stem on the existing actuator. The adaptive sleeve 118 is typically made of injection molded plastic, but in some embodiments may be made by other suitable methods with other suitable materials.

The housing base 106 has a threaded adjustment hole 134 connecting the base cavity 130 with the base stem cavity 132. The adjustment hole 134 is threaded to permit a set screw 136 to engage with it. The set screw 136 is configured for adjusting the height of the second housing 102 relative to the adaptive sleeve 118. Thus the adaptive sleeve 118, the set screw 136 and the adjustment hole 134 together comprise a height adjustment mechanism, controlling the distance between the second housing 102 and the first housing 108. This allows sufficient clearance to be established and maintained between the second housing 102 and the first housing 108 as well as the appliance surface 126, allowing smooth operation of the actuator when turning the second housing 102. The height adjustment mechanism may also be used to adjust the sensitivity of the sensor 114 by changing the distance between the sensor 114 and the sensor trigger 116.

Installing the first embodiment wireless actuator position sensor assembly 100 typically is done to replace an existing knob of an actuator in an appliance, though it may be installed as original equipment. Once the original knob is removed from the actuator stem 124, the first housing 108 is positioned on the appliance surface 126 with the actuator stem 124 passing through the first housing cavity 109. The first housing 108 couples to the appliance surface 126 or to the actuator with adhesive or some other fastening mechanism. Once installed, the first housing 108 should not move or rotate relative to the actuator. Next, the adaptive sleeve 118 is placed over the actuator stem 124, with the actuator stem 124 inserting into the sleeve center cavity 120. For some actuators, the actuator stem 124 changes cross-sectional shape part way down from a top of the actuator stem 124, becoming wider and forming a ledge. The adaptive sleeve 118 is pushed down over the actuator stem 124 until it contacts the ledge. In other embodiments, the actuator stem 124 does not change cross-section and in that case, the adaptive sleeve 118 is pushed down until it contacts the main body of the actuator.

The housing base 106 is then placed over the actuator, with the base stem 128 over the actuator stem 124 and adaptive sleeve 118. The base stem 128 is then pushed down over the adaptive sleeve 118 with the adaptive sleeve 118 inserting into the base stem cavity 132 until the adaptive sleeve 118 contacts the top of the base stem cavity 132. The set screw 136 is placed into the adjustment hole 134 and screwed down until it contacts the adaptive sleeve 118. The set screw 136 can then be screwed down further still, pushing against the adaptive sleeve 118 and increasing the height of the housing base 106 up above the actuator and the first housing 108, stopping when the desired height is reached. The electronic circuitry 110 is then placed in the base cavity 130, if it is not already installed. Installation is done in such a manner so as to result in proper alignment between the actuator, the sensor trigger 116 and the sensor 114. In the first embodiment, the proper alignment is with the sensor 114 over the sensor trigger 116 when the actuator is in an off operational state. However, in other embodiments, other alignments are used such as the sensor 114 over the sensor trigger 116 when the actuator is in an on operational state or a 50% power operational state.

The electronic circuitry 110 of the first embodiment wireless actuator position sensor assembly 100 is configured for transmitting information about the rotational position of the actuator stem 124. In some embodiments, the electronic circuitry 110 is configured for periodically transmitting information regarding the operational state of the actuator. In other embodiments, the electronic circuitry 110 is configured for transmitting information regarding the rotational position of the actuator stem 124 when the rotational position of the actuator stem 124 changes. In other embodiments, the electronic circuitry 110 is configured for transmitting information regarding the rotational position of the actuator stem 124 when it receives a request to do so.

In operation, the first embodiment wireless actuator position sensor assembly 100 typically starts with the actuator in an off operational state, with a rotational position with the sensor 114 lined up over the sensor trigger 116. A user turns the second housing 102, which turns the actuator away from the off position and the sensor 114 from over the sensor trigger 116, which remains stationary. The electronic circuitry 110, based on a signal from the sensor 114 determines the sensor 114 no longer detects the proximity of the sensor trigger 116 and so transmits information regarding the change of position of the actuator.

Second Embodiment

Figure 2A:
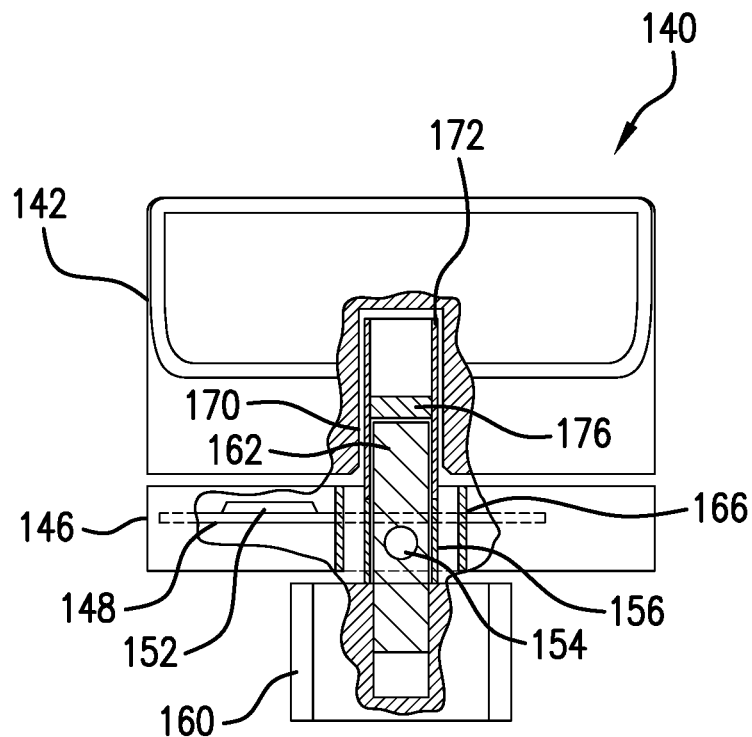
FIG. 2A is a side elevation view of a second embodiment wireless actuator position sensor assembly.
Figure 2B:
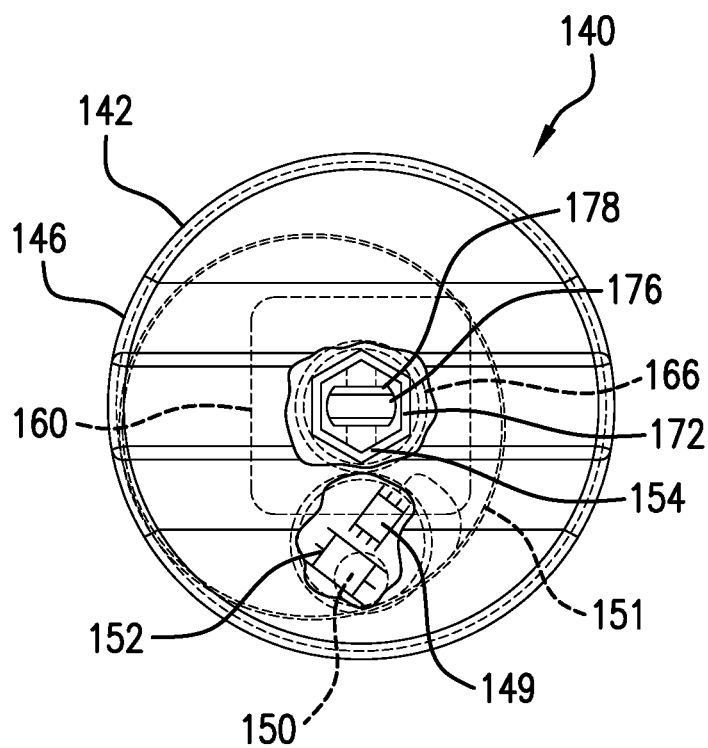
FIG. 2B is a top plan view of the second embodiment wireless actuator position sensor assembly.
Figure 2C:
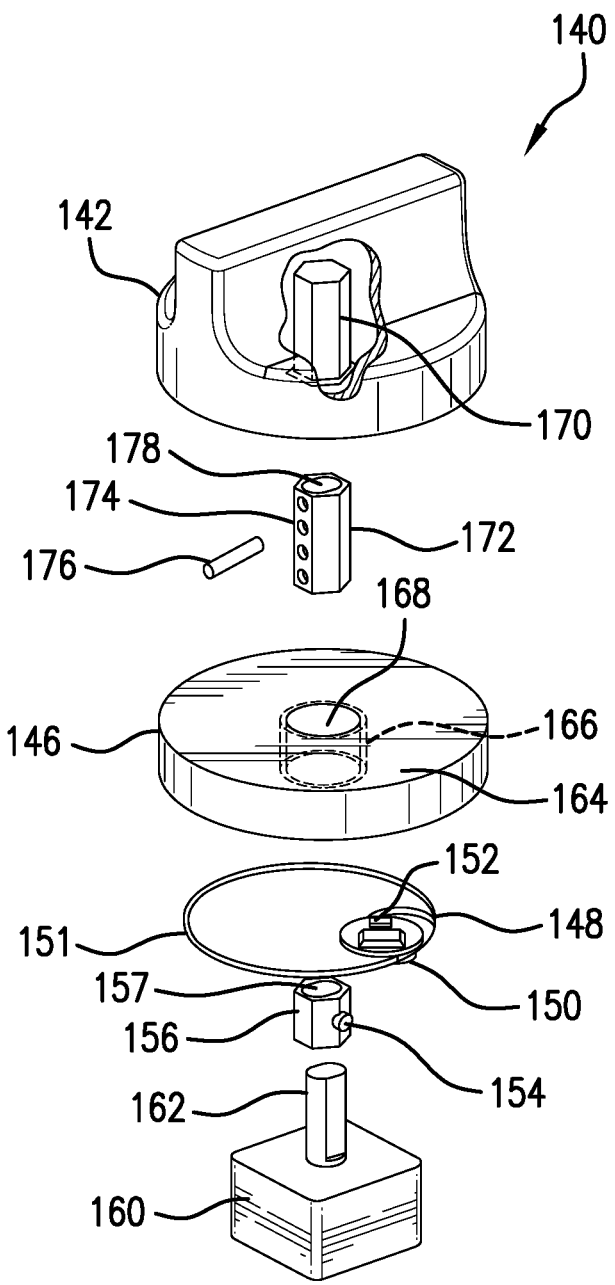
FIG. 2C is an exploded isometric view of the second embodiment wireless actuator position sensor assembly

FIGS. 2A, 2B and 2C show a second embodiment of a wireless actuator position sensor assembly 140. The second embodiment wireless actuator position sensor assembly 140 is similar to the first embodiment wireless actuator position sensor assembly 100, but with some differences, most notably the location of the electronics, the sensor trigger, and the mechanism for adjusting the distance between the first and second housings. The second embodiment wireless actuator position sensor assembly 140 is configured for coupling to an actuator with an actuator body 160 and an actuator stem 162. The second embodiment wireless actuator position sensor assembly 140 comprises a first housing 146, a second housing 142, electronic circuitry 148 (including a sensor 152), a sensor trigger 154, a trigger sleeve 156, an adaptive sleeve 172, and a pin 176. In some embodiments, the second housing 142 is a pre-existing OEM knob or handle that the adaptive sleeve 172 is designed to work with, but in other embodiments, the second housing 142 is a replacement knob specifically designed to work with the adaptive sleeve 172.

The first housing 146 houses the electronic circuitry 148. In the second embodiment 140, the first housing 146 has a shape of a thin annular cylinder. In other embodiments the first housing 146 may have another suitable shape, such as a thin annular box. In order to correctly indicate the rotational position of the actuator stem 162, the first housing 146 is configured for coupling to the actuator body 160 in a manner so that when coupled, the first housing 146 is in a fixed relation with the actuator body 160 and cannot move laterally or rotationally relative to the actuator body 160. In the second embodiment 140, the first housing 146 is configured for coupling to the actuator body 160 indirectly, by coupling to the appliance surface 126, which in turn is coupled to the actuator body 160, typically with an adhesive, or by suction, welding or mechanical fastener such as screws. The first housing 146 has a first housing stem 166 with a first housing stem cavity (opening or bore) 168 configured for accepting insertion of the actuator stem 162 and for accepting insertion of the trigger sleeve 156 sliding over the actuator stem 162. In the second embodiment, the first housing stem 166 is located in the exact center of the first housing 146, but in other embodiments may be located off-center. In some embodiments, the first housing stem 166 is replaced by a hole in the bottom of the first housing 146. The first housing 146 is typically made of injection molded plastic, but in some embodiments may be made by other suitable methods with other suitable materials.

Figure 11A:
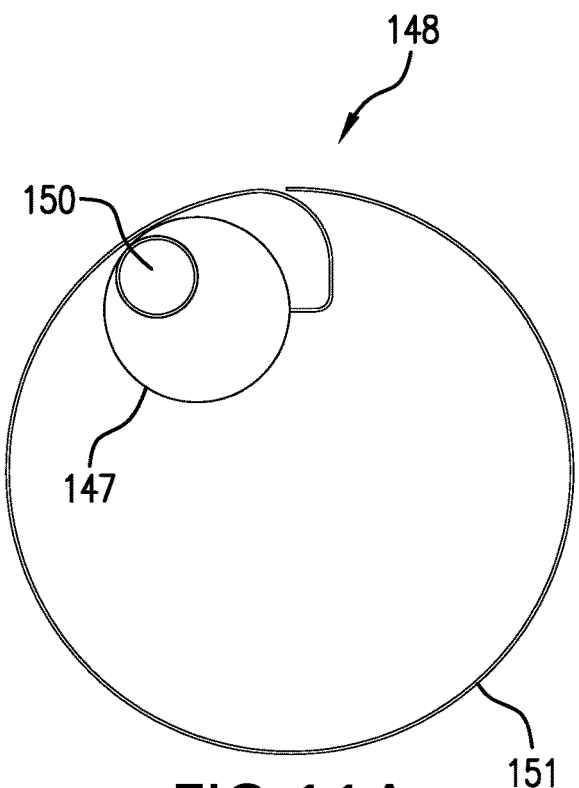
FIG. 11A is a top plan view of the electronic circuitry of the second embodiment wireless actuator position sensor assembly.
Figure 11B:
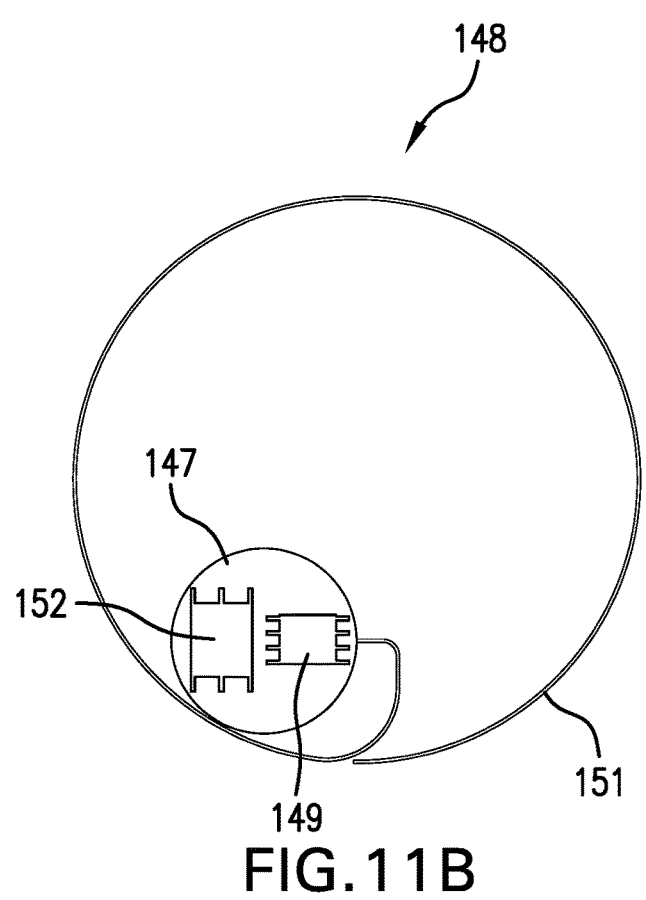
FIG. 11B is a bottom plan view of the electronic circuitry of the second embodiment wireless actuator position sensor assembly.

The electronic circuitry 148 is positioned within the first housing 146 and secured thereto. Specifically, the sensor 152 is secured to the first housing 146, either directly or indirectly, in a manner that fixes the location of the sensor 152, laterally and rotationally, relative the actuator body 160, when the first housing 146 is coupled to the actuator body 160. In the second embodiment, the electronic circuitry 148 includes a circuit board 147, a battery 150, the sensor 152, a radio frequency (RF) transmitter 149. The electronic circuitry 148 includes a microcontroller (not shown) for controlling and coordinating the activities of the other components of the electronic circuitry 148. The circuit board 147 serves as a mounting platform for the other components of the electronic circuitry 148 and the circuit board 147 is coupled to the first housing 146. (See FIGS. 11A and 11B). In other embodiments, some of the components may be coupled to first housing 146 in other ways and not mounted on the circuit board 147. In the second embodiment, the electronic circuitry 148 includes an antenna 151, coupled to the transmitter 149 and configured to coil to fit within a first housing cavity (a void space) 164. The sensor 152 in the second embodiment is a magnetic-field detector, specifically a reed switch, but in other embodiments may be some other kind of magnetic-field detector, such as a hall-effect detector, or may be some other type of sensor such as an RFID transmitter, a radiation detector, or a photo detector. The sensor 152 is configured for generating a signal based on the proximity of the sensor trigger 154 to the sensor 152. The transmitter 149 and other components of electronic circuitry 148 are configured for transmitting information about the rotational position of the actuator stem 162 based on the signal from the sensor 152.

In the second embodiment, the electronic circuitry 148 is a Honeywell 5800Micra Wireless Recessed Transmitter with the external plastic housing removed and the sensor trigger 154 is a magnet that is provided with the 5800Micra. The reed switch (sensor 152) is configured to be in a first state (e.g. open) if the magnet (sensor trigger 154) is within one half inch of the reed switch (and the pole of the magnet is in proper alignment with the reed switch), and configured to be in a second state if the magnet is further away than one half inch. The reed switch (sensor 152) changing state from open to closed, or from closed to open, constitutes an event. For each event, the transmitter 149 transmits a message according to the Honeywell 5800 Transmission Protocol. The message is 64 bits in length with 16 bits for CRC and 24 bits for a serial number unique to the transmitter 149. For each event, the transmitter 149 sends the message 10 times, with different spacing between the repeated messages to avoid clashes with other transmitters. The transmitter 149 transmits in the 345 MHz narrow band frequency range. However, in other embodiments, the electronic circuitry 148 may have a different set of components than those of the 5800Micra, may transmit in other frequency ranges, according to other communications protocols, such as Bluetooth®, Z-wave®, ZigBee®, Random Phase Multiple Access (RMPA), or LoRaWAN™. In some embodiments, the electronic circuitry 148 also includes an RF receiver. The RF receiver may be configured for receiving commands or for receiving acknowledgements and other communications used to execute the communications protocol.

The second housing 142 includes a mating cavity 170. The mating cavity 170 is configured for accepting insertion of the adaptive sleeve 172 therein, having a shape and size similar to that of the adaptive sleeve 172 so that when the second housing 142 is rotated, the adaptive sleeve 172 rotates as well. In the second embodiment, the adaptive sleeve 172 inserts into the mating cavity 170 with a sliding fit or a location fit, but in other embodiments may have a looser or tighter fit. A looser fit will allow some play between the adaptive sleeve 172 and the mating cavity 170, which may not be desirable. A tighter fit may also not be desirable as it may prevent easy removal of the adaptive sleeve 172 for changing the height adjustment of the second housing 142. In the second embodiment, the mating cavity 170 and the exterior of the adaptive sleeve 172 have cross-sections that are hexagonal in shape, but may have different cross-sectional shapes in other embodiments. The second housing 142 is typically made of injection molded plastic, but in some embodiments may be made by other suitable methods with other suitable materials.

Figure 5A:
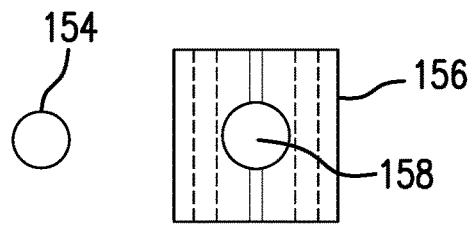
FIG. 5A is a front elevation view of a sensor trigger and a trigger sleeve.
Figure 5B:
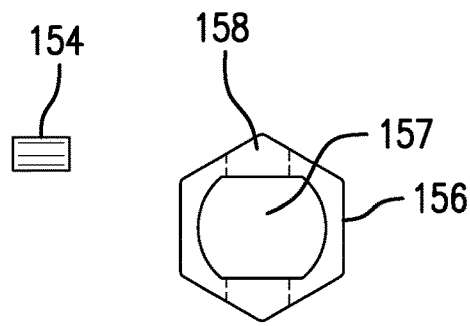
FIG. 5B is a top plan view of the sensor trigger and the trigger sleeve.

The trigger sleeve 156 has a trigger sleeve cavity 157 (see FIGS. 5A and 5B) through its long axis and is configured for accepting insertion of the actuator stem 162 therein. The trigger sleeve cavity 157 is configured such that when the actuator stem 162 is inserted and the actuator stem 162 rotates, the trigger sleeve 156 rotates as well. Typically, the trigger sleeve cavity 157 is configured to have a fit with the actuator stem 162 that is a sliding fit or a location fit. The trigger sleeve 156 has a trigger hole 158 configured for a sensor trigger 154 to be inserted therein. In the second embodiment 140, the trigger hole 158 and the sensor trigger 154 each have a cross-sectional shape that is circular, but in other embodiments may be square or some other suitable shape. Typically, the sensor trigger 154 and trigger hole 158 are configured for a location fit, but in some embodiments may have a tighter or looser fit. A looser fit may be undesirable as the sensor trigger 154 could fall out inadvertently. The trigger sleeve 156 is configured with a size and shape for insertion into the first housing stem cavity 168 with a sliding fit or looser, permitting the trigger sleeve 156 to rotate freely with the first housing stem cavity 168. In the second embodiment, the exterior of the trigger sleeve 156 has a hexagonal cross-sectional shape, but may have other cross-sectional shapes in other embodiments. In the second embodiment, the sensor trigger 154 is a magnet, but in other embodiments, may be some other material or device that triggers the sensor 152, such a radioisotope, photoluminescent source, or RFID tag. The trigger sleeve 156 is typically made of injection molded plastic, but in some embodiments may be made by other suitable methods with other suitable materials.

Figure 6A:
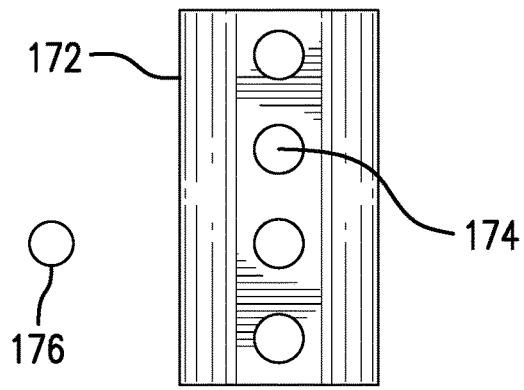
FIG. 6A is a front elevation view of a pin and an adaptive sleeve.
Figure 6B:
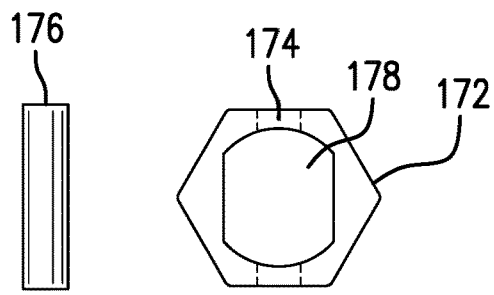
FIG. 6B is a top plan view of the pin and the adaptive sleeve.

The adaptive sleeve 172 has a sleeve center cavity 178 (see FIGS. 6A and 6B) configured for accepting insertion of the actuator stem 162 therein. The adaptive sleeve 172 is configured such that when the actuator stem 162 is inserted and the adaptive sleeve 172 is rotated, the actuator stem 162 is rotated as well. Typically, the sleeve center cavity 178 and the actuator stem 162 have a sliding fit or a location fit. In other embodiments the sleeve center cavity 178 may have a tighter or a looser fit with the actuator stem 162. A looser fit will allow some play which may not be desirable. The sleeve center cavity 178 has a flat-sided-circle shaped cross-section to match the flat-sided-circle shape cross-section of the actuator stem 162. However, not all actuators will have an actuator stem with a flat-sided-circle shaped cross-section, but may have actuator stems with other cross-sectional shapes such as square or hexagonal. Thus in other embodiments, the sleeve center cavity 178 will have a different cross-section, one selected for mating with a specific shape of actuator stem. In some embodiments, the second embodiment wireless actuator position sensor assembly 140 has multiple adaptive sleeves, each with a sleeve center cavity of a different shape, configured for different types of actuator stems. A user can select the appropriate adaptive sleeve to use. The adaptive sleeve 172 is typically made of injection molded plastic, but in some embodiments may be made by other suitable methods with other suitable materials.

The adaptive sleeve 172 has a plurality of pin holes 174 therein, orthogonal to the long axis of the adaptive sleeve 172. Each pin hole 174 is configured for accepting insertion of the pin 176 therein. The pin 176 is configured with a size and shape to allow it to insert in a first of the pin holes 174, through the sleeve center cavity 178 and through a second of the pin holes 174 directly across the sleeve center cavity 178. In the second embodiment, the pin 176 and the pin holes 174 have a circular cross-sectional shape, but in other embodiments may by square or some other appropriate shape. The pin 176 has a length sufficient to allow it to insert fully into both the first and second pin holes 174 at the same time, but not longer than the width of the mating cavity 170, so that the pin 176 will not interfere with the adaptive sleeve 172 inserting into the mating cavity 170 while the pin 176 is inserted into the adaptive sleeve 172. The pin 176 inserted into the pin hole 174 of the adaptive sleeve 172 controls the height of the second housing 142 above the actuator and above the first housing 146. With the pin 176 inserted into one of the pin holes 174, and the adaptive sleeve 172 inserted into the mating cavity 170, the pin hole 174 limits how far down the actuator stem 162 the second housing 142 and adaptive sleeve 172 can be pushed. Thus the adaptive sleeve 172 and pin 176 comprise a height adjustment mechanism, controlling the distance between the second housing 142 and the first housing 146. This allows sufficient clearance to be set between the second housing 142 and the first housing 146 for smooth operation of the actuator when turning the second housing 142. This is a simpler, easier to use, easier and less costly to manufacture height adjustment mechanism than the set screw 136 of the first embodiment wireless actuator position sensor assembly 100 since no threaded components need to be made.

Installing the second embodiment wireless actuator position sensor assembly 140 is typically done replacing an existing knob of an actuator in an appliance, though it may be installed as original equipment. Once the original knob is removed from the actuator stem 162 of the actuator, the first housing 146 is positioned over the actuator with the actuator stem 162 passing through the first housing stem cavity 168. The first housing 146 couples to the appliance surface 126 or to the actuator with adhesive or some other fastening mechanism. Once installed, the first housing 146 should not move or rotate relative to the actuator. Next, the sensor trigger 154 is inserted into the trigger hole 158 of the trigger sleeve 156. The trigger sleeve 156 is then inserted into the first housing stem cavity 168 with actuator stem 162 inserted into the trigger sleeve cavity 157. For some actuators, the actuator stem 162 changes cross-sectional shape part way down from a top of the actuator stem 162, becoming wider and forming a ledge. The trigger sleeve 156 is pushed down over the actuator stem 162 until it contacts the ledge. In other embodiments, the actuator stem 162 does not change cross-section and in that case, the trigger sleeve 156 is pushed down until it contacts the actuator body 160. The electronic circuitry 148, including the sensor 152, is then placed in first housing cavity 164 and secured thereto, if it is not already installed.

The pin 176 is inserted into the one of the pin holes 174 of the adaptive sleeve 172. Which pin hole 174 of the adaptive sleeve 172 the pin 176 is inserted into will set the height of the adaptive sleeve 172 and the second housing 142 above the actuator body 160. Next, the adaptive sleeve 172 is placed over the actuator stem 162, with the actuator stem 162 inserting into the sleeve center cavity 178. The adaptive sleeve 172 is pushed down over the actuator stem 162 until the top of the actuator stem 162 contacts the pin 176 or the adaptive sleeve 172 contacts the trigger sleeve 156. The second housing 142 is then placed over the adaptive sleeve 172, with adaptive sleeve 172 inserting into the mating cavity 170. The second housing 142 is pushed down over the adaptive sleeve 172 until the adaptive sleeve 172 contacts the top of the mating cavity 170. Installation is done in such a manner so as to result in proper alignment between the actuator, the sensor trigger 154 and the sensor 152. In the second embodiment, the proper alignment is with the sensor 152 positioned with the first housing cavity 164 so that it is closest to the sensor trigger 154 when the actuator is in an off position. However, in other embodiments, other alignments are used such as the sensor 152 is closest to sensor trigger 154 when the actuator is in an on position or a 50% power position.

The electronic circuitry 148 of the second embodiment wireless actuator position sensor assembly 140 is configured for transmitting information about the rotational position of the actuator stem 162. In some embodiments, the electronic circuitry 148 is configured for periodically transmitting information regarding the rotational position of the actuator stem 162. In other embodiments, the electronic circuitry 148 is configured for reporting the rotational position of the actuator stem 162 when the rotational position of the actuator stem 162 changes. In other embodiments, the electronic circuitry 148 is configured for transmitting information regarding the rotational position of the actuator stem 162 when it receives a request to do so.

In operation, the second embodiment wireless actuator position sensor assembly 140 typically starts with the actuator in an off position, with the sensor 152 in proximity to the sensor trigger 154. A user turns the second housing 142, which turns the actuator away from the off position and rotates the sensor trigger 154 away from the sensor 152, which remains stationary. The electronic circuitry 148, based on a signal from the sensor 152, determines that sensor 152 no longer detects the proximity of the sensor trigger 154 and so transmits information regarding the change of position of the actuator.

Third Embodiment

Figure 3A:
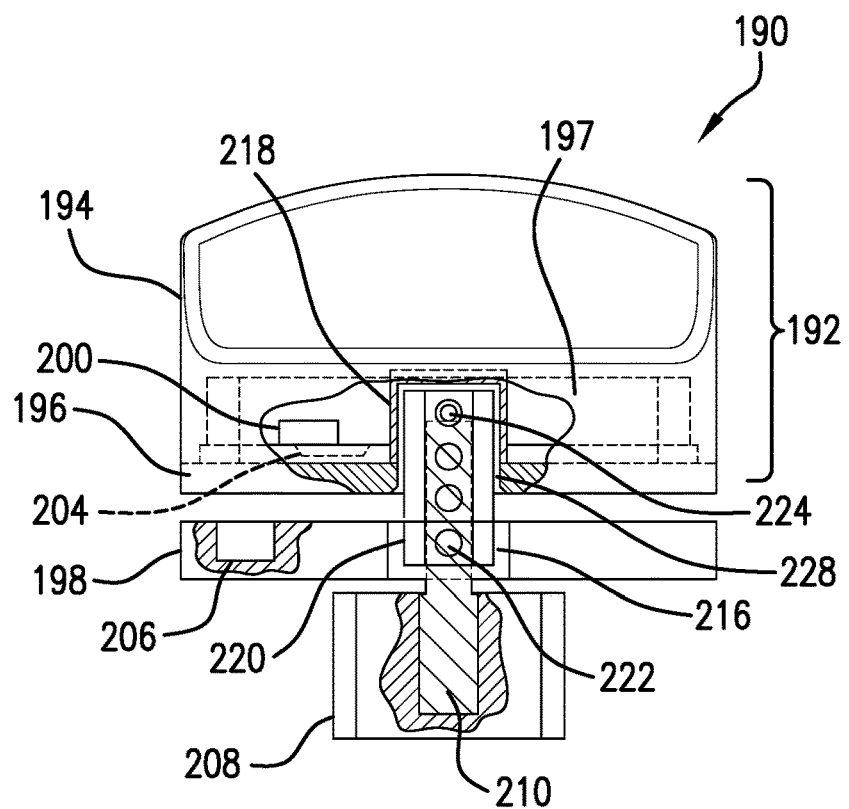
FIG. 3A is a side elevation view of a third embodiment wireless actuator position sensor assembly.
Figure 3B:
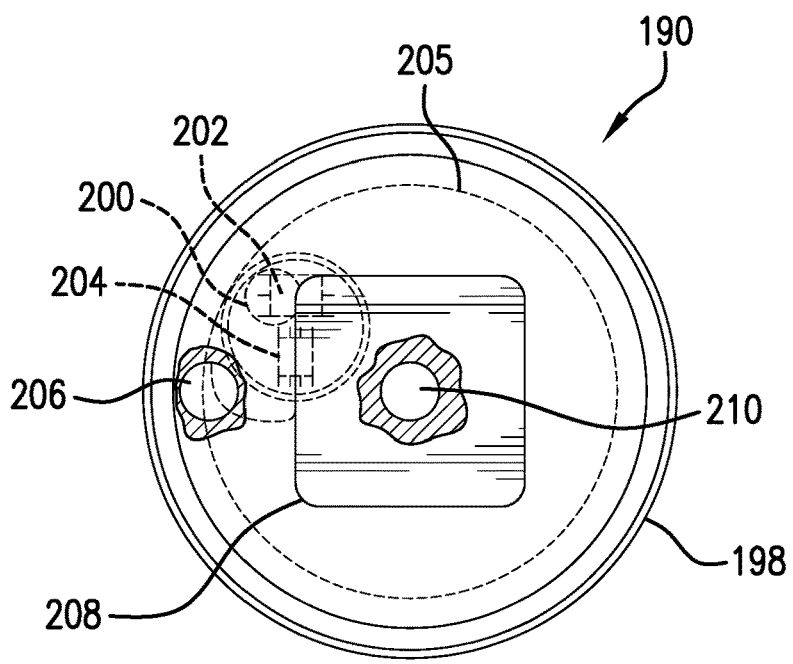
FIG. 3B is a top plan view of the third embodiment wireless actuator position sensor assembly.
Figure 3C:
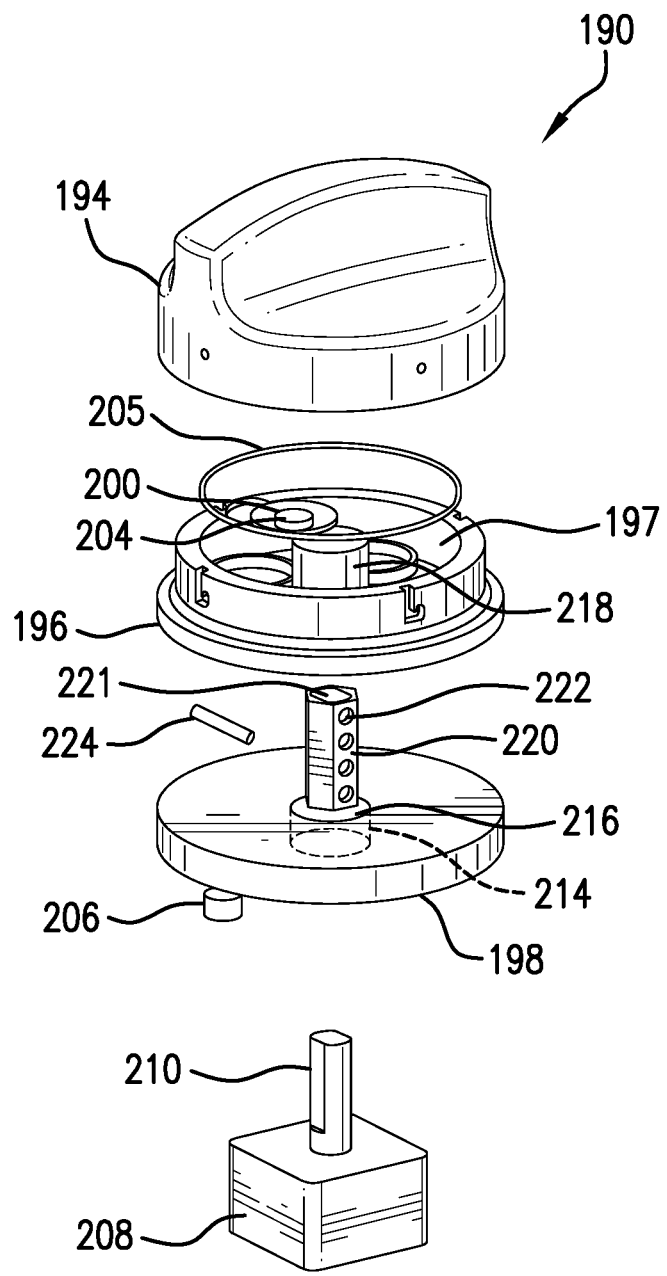
FIG. 3C is an exploded isometric view of the third embodiment wireless actuator position sensor assembly.

FIGS. 3A, 3B and 3C show a third embodiment of a wireless actuator position sensor assembly 190. The third embodiment 190 is similar to the first embodiment 100 and second embodiment 140, but with some differences, most notably the mechanism for adjustment of the distance between the first and second housings and the location of sensor trigger and the electronics. The third embodiment wireless actuator position sensor assembly 190 is configured for coupling to an actuator with an actuator body 208 and an actuator stem 210. The third embodiment wireless actuator position sensor assembly 190 comprises a first housing 198, a second housing 192, a sensor trigger 206, electronic circuitry 200 (including a sensor 204), a pin 224, and an adaptive sleeve 220.

The first housing 198 houses the sensor trigger 206. In the third embodiment 190, the first housing 198 has a shape of a thin annular cylinder, but in other embodiments may have another suitable shape, such as a thin annular box. The first housing 198 is configured for coupling to the actuator body 208, either indirectly by being coupled to the appliance surface or directly by being coupled to the actuator body 208 itself, typically with an adhesive, or by suction, welding or mechanical fastener such as screws. In order to correctly indicate the rotational position of the actuator stem 210, the first housing 198 is coupled to the actuator body 208 in a manner so that it cannot move laterally or rotationally relative to the actuator body 208. The first housing 198 has a first housing stem 214 with a first housing stem cavity 216 configured to accept insertion of the actuator stem 210 into the first housing 198. In the third embodiment, the first housing stem 214 is located in the exact center of the first housing 198, but in other embodiments may be located off-center. In the third embodiment wireless actuator position sensor assembly 190, the sensor trigger 206 is positioned with the first housing 198 and coupled thereto. The first housing 198 is typically made of injection molded plastic, but in some embodiments may be made by other suitable methods with other suitable materials.

The second housing 192 comprises a housing top 194, a housing base 196, and electronic circuitry 200. The housing base 196 has a housing base cavity 197 into which the electronic circuitry 200 is positioned. The electronic circuitry 200 is secured to the second housing 192. Specifically, the sensor 204 is secured to the second housing 192. This ensures the location of the sensor 204 is fixed relative to the actuator stem 210 when the second housing 192 is coupled to the actuator stem 210. In the third embodiment, the housing base 196 and the housing top 194 are configured to detachably couple with a mechanical locking mechanism. In other embodiments the housing base 196 and housing top 194 may be configured to couple in other ways, such as mechanical fasteners (e.g. screws), clips or adhesive. The housing base 196 has a base stem 218 protruding up into the housing base cavity (internal recess) 197 from the bottom of the housing base 196 with a base stem cavity 228 therein. The base stem cavity 228 is closed on top and open through the bottom of the housing base 196. The base stem cavity 228 is configured for the adaptive sleeve 220 to be inserted therein, having a shape and size similar to that of the adaptive sleeve 220 so that when the second housing 192 is rotated, the adaptive sleeve 220 rotates as well. In the third embodiment, the adaptive sleeve 220 inserts into the base stem cavity 228 with a sliding fit or a location fit, but in other embodiments may have a looser or tighter fit. A looser fit will allow some play between the adaptive sleeve 220 and the second housing 192, which may not be desirable. A tighter fit may also be undesirable as it may interfere with height adjustment of the second housing 192, though the third embodiment is not as sensitive to this as the first embodiment. In the third embodiment, the base stem cavity 228 and the exterior of the adaptive sleeve 220 have cross-sections that are hexagonal in shape, but may have different cross-sectional shapes in other embodiments. The housing top 194 and the housing base 196 are typically made of injection molded plastic, but in some embodiments may be made by other suitable methods with other suitable materials.

In the third embodiment wireless actuator position sensor assembly 190, the electronic circuitry 200 includes a battery 202, a sensor 204 and other circuitry such as a radio frequency (RF) transmitter. The electronic circuitry 200 of the third embodiment wireless actuator position sensor assembly 190 is similar to the electronic circuitry 148 of the second embodiment wireless actuator position sensor assembly 140 (See FIGS. 11A and 11B). In the third embodiment, the electronic circuitry 200 includes an antenna 205, which is configured to coil to fit within the second housing 192. The sensor 204 in the third embodiment is a magnetic-field detector, but in other embodiments may be some other type of sensor such as a radiation detector or a photo detector. The sensor 204 and other components of electronic circuitry 200 are configured to detect the presence or absence of the sensor trigger 206 in the vicinity of the sensor 204. The RF transmitter is configured for transmitting information about the actuator position. In some embodiments, the electronic circuitry 200 also includes an RF receiver. The RF receiver may be configured for receiving commands or for receiving acknowledgements and other communications used to execute the communications protocol.

The adaptive sleeve 220 has a sleeve center cavity 221 configured for the actuator stem 210 to be inserted therein. The adaptive sleeve 220 is configured for rotating the actuator stem 210 when the adaptive sleeve 220 is rotated. Typically, the sleeve center cavity 221 and the actuator stem 210 have a sliding fit or a location fit, but in other embodiments may have a tighter or a looser fit. A looser fit will allow some play which may not be desirable. The sleeve center cavity 221 has a flat-sided-circle shaped cross-section to match the flat-sided-circle shape cross-section of the actuator stem 210. However, not all actuators will have an actuator stem with a flat-sided-circle shaped cross-section, but will have actuator stems with other cross-sectional shapes such as square or hexagonal. Thus in other embodiments, the sleeve center cavity 221 will have a different cross-section, one selected for mating with a specific shape of actuator stem. In some embodiments, the third embodiment wireless actuator position sensor assembly 190 has multiple adaptive sleeves, each with a sleeve center cavity of a different shape, configured for different types of actuator stems. A user can select the appropriate adaptive sleeve to use. The adaptive sleeve 220 is typically made of injection molded plastic, but in some embodiments may be made by other suitable methods with other suitable materials.

The adaptive sleeve 220 has a plurality of pin holes 222 therein, orthogonal to the long axis of the adaptive sleeve 220. The pin 224 is configured with a size and shape to allow it to insert in a first of the pin holes 222, through the sleeve center cavity 221 and through a second of the pin holes 222 directly across the sleeve center cavity 221. In the third embodiment, the pin 224 and the pin holes 222 have a circular cross-sectional shape, but in other embodiments may be square or some other appropriate shape. The pin 224 has a length sufficient to allow it to insert fully into both the first and second pin holes 222 at the same time, but not longer than the width of the base stem cavity 228, so that the pin 224 will not interfere with the adaptive sleeve 220 inserting into the housing base cavity 197 while the pin 224 is inserted into the adaptive sleeve 220. The pin 224 inserted into the pin hole 222 controls the height of the second housing 192 above the actuator body 208 and the first housing 198. With the pin 224 inserted into one of the pin holes 222, and the adaptive sleeve 220 inserted into the base stem cavity 228, the pin hole 222 limits how far down the actuator stem 210 the second housing 192 and the adaptive sleeve 220 can be pushed. Thus the adaptive sleeve 220 and pin 224 comprise a height adjustment mechanism, controlling the distance between the second housing 192 and the first housing 198. This allows for setting sufficient clearance between the second housing 192 and the first housing 198 for smooth operation of the actuator when turning the second housing 192.

Installing the third embodiment wireless actuator position sensor assembly 190 is typically done to replace an existing knob of an actuator in an appliance, though it may be installed as original equipment. Once the original knob is removed from the actuator stem 210, the first housing 198 is positioned over the actuator body 208 with the actuator stem 210 passing through the first housing stem cavity 216. The first housing 198 couples to the appliance surface or to the actuator body 208 with adhesive or some other fastening mechanism. Once installed, the first housing 198 should not move or rotate relative to the actuator body 208.

Next, the pin 224 is inserted into the one of the pin holes 222 of the adaptive sleeve 220. Which pin hole 222 the pin 224 is inserted into will set the height of the adaptive sleeve 220 and the second housing 192. Next, the adaptive sleeve 220 is placed over the actuator stem 210, with the actuator stem 210 inserting into the sleeve center cavity 221. The adaptive sleeve 220 is pushed down over the actuator stem 210 until the top of the actuator stem 210 contacts the pin 224 or the adaptive sleeve 220 contacts and is blocked by some other structure. For the actuator in the third embodiment, the actuator stem 210 changes cross-sectional shape part way down from a top of the actuator stem 210, becoming wider and forming a ledge. The adaptive sleeve 220 is pushed down over the actuator stem 210 until it contacts the ledge. In other embodiments, the actuator stem 210 does not change cross-sectional shape and in that case, the adaptive sleeve 220 is pushed down until it contacts the actuator body 208.

The housing base 196 is then placed over the actuator body 208, with the base stem cavity 228 over the actuator stem 210 and the adaptive sleeve 220. The housing base 196 is pushed down over the adaptive sleeve 220 with the adaptive sleeve 220 inserting into the base stem cavity 228 until the adaptive sleeve 220 contacts the top of the base stem cavity 228.

The electronic circuitry 200, including the sensor 204, is then placed in housing base cavity 197, if it is not already installed. Installation is done in such a manner so as to result in proper alignment between the actuator body 208, the sensor trigger 206 and the sensor 204. In the third embodiment, the proper alignment is with the sensor 204 over the sensor trigger 206 when the actuator is in an off position. However, in other embodiments, other alignments are used such as the sensor 204 over the sensor trigger 206 when the actuator is in an on position or a 50% power position.

The electronic circuitry 200 of the third embodiment wireless actuator position sensor assembly 190 is configured for transmitting information about the rotational position of the actuator stem 210. In some embodiments, the electronic circuitry 200 is configured for periodically transmitting information regarding the rotational position of the actuator stem 210. In other embodiments, the electronic circuitry 200 is configured for reporting the rotational position of the actuator stem 210 when the rotational position of the actuator stem 210 changes. In other embodiments, the electronic circuitry 200 is configured for transmitting information regarding the rotational position of the actuator stem 210 when it receives a request to do so.

In operation, the third embodiment wireless actuator position sensor assembly 190 typically starts with the actuator in an off position, with the sensor 204 in proximity to the sensor trigger 206. A user rotates the second housing 192, which rotates the actuator away from the off position and moves the sensor 204 away from the sensor trigger 206, which remains stationary. The electronic circuitry 200, based on a signal from the sensor 204, determines the sensor 204 no longer detects the proximity of the sensor trigger 206 and so transmits information regarding the change of position of the actuator.

Fourth Embodiment

Figure 4A:
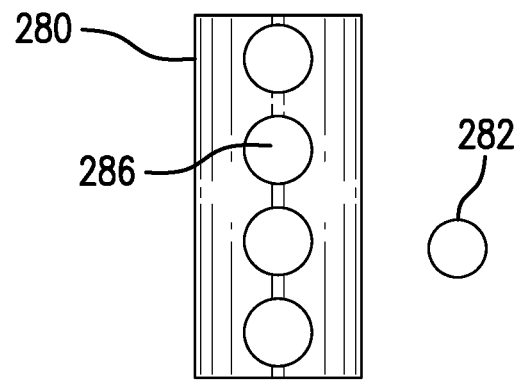
FIG. 4A is a side elevation view of a sensor trigger and a combined sleeve.
Figure 4B:
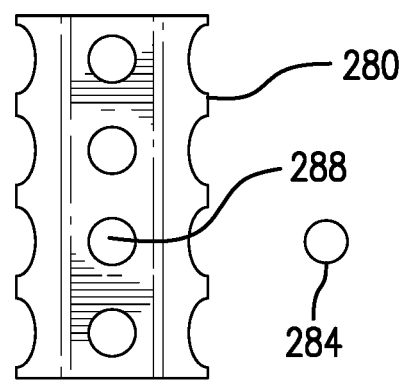
FIG. 4B is a front elevation view of a pin and the combined sleeve.
Figure 4C:
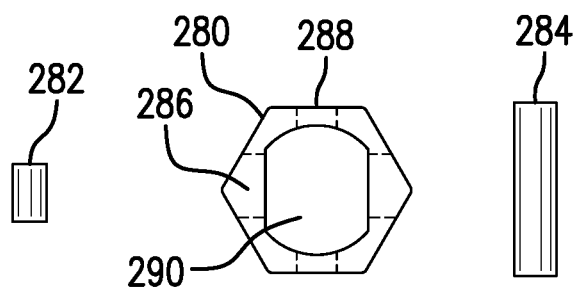
FIG. 4C is a top plan view of the pin, the sensor trigger and the combined sleeve.

FIGS. 4A, 4B and 4C show a combined sleeve 280. The combined sleeve 280 is used in combination with the second embodiment wireless actuator position sensor assembly 140, replacing the adaptive sleeve 172 and the trigger sleeve 156, thereby constituting a fourth embodiment of a wireless actuator position sensor. The combined sleeve 280 has one or more pin holes 288 penetrating through orthogonal to a long axis of the combined sleeve 280 and a sleeve cavity 290 in the combined sleeve 280. The combined sleeve 280 also has one or more trigger holes 286 penetrating through orthogonal to the long axis of the combined sleeve 280 and orthogonal to the one or more pin holes 288. A sensor trigger 282 may be placed in one of the trigger holes 286 and a pin 284 may be placed in one of the pin holes 288.

The combined sleeve 280 is a simpler, but less robust arrangement than the separated trigger sleeve 156 and adaptive sleeve 172. In situations where a less robust sleeve will do, it may be preferable.

The combined sleeve 280 or adaptive sleeve 172 may be useful in other instances than with all the components of the second embodiment wireless actuator position sensor assembly 140. For instance, the combined sleeve 280 or adaptive sleeve 172 could be used with the second housing 142 to replace an existing knob that does not have correct clearances.

Fifth Embodiment

Figure 7:
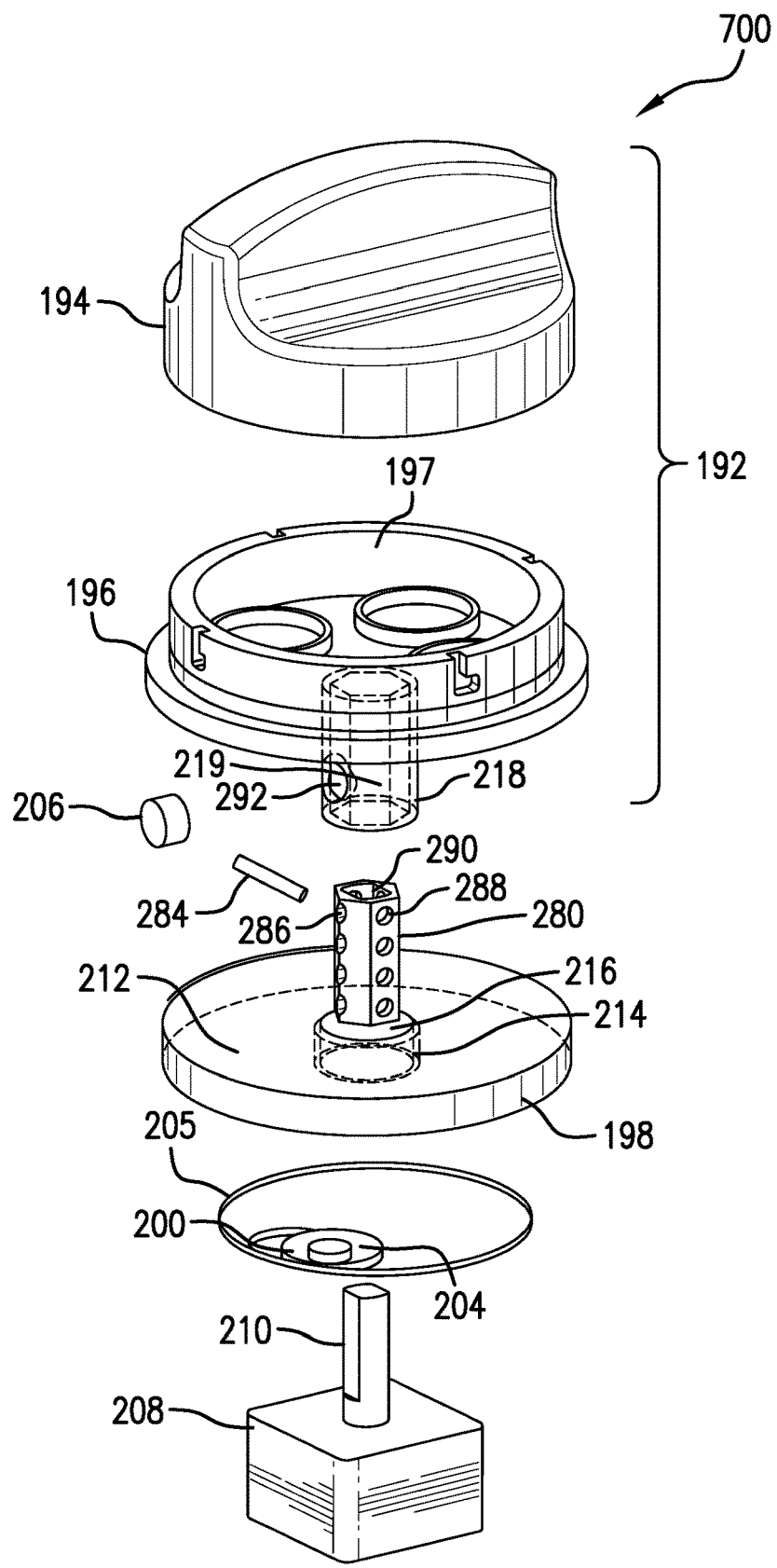
FIG. 7 is an exploded isometric view of a fifth embodiment wireless actuator position sensor assembly.

FIG. 7 shows a fifth embodiment wireless actuator position sensor assembly 700. The fifth embodiment 700 is similar to the third embodiment 190, with the following noted differences. The base stem 218 extends below the housing base 196. The base stem 218 includes a stem trigger hole 292 configured for accepting insertion of the sensor trigger 206. The adaptive sleeve 280 with trigger holes 286 as shown in FIGS. 4A-4C used instead of the adaptive sleeve 220 as shown in FIG. 3C. To install the fifth embodiment assembly 700, the electronic circuitry 200 is installed in the first housing 198, if it is not installed already. The first housing 198, the adaptive sleeve 280 and pin 284 are installed as in the third embodiment 190. The sensor trigger 206 is inserted into the stem trigger hole 292 and into one of the trigger holes 286 of the adaptive sleeve 280. The second housing 192 is positioned over the adaptive sleeve 280 (already mated to the actuator stem 210) and then pushed down over the adaptive sleeve 280, the base stem 218 inserting into the first housing stem cavity 216 and the base stem cavity 219 accepting insertion of the adaptive sleeve 280. In operation, the fifth embodiment wireless actuator position sensor assembly 700 typically starts with the actuator in an off position, with the sensor 204 in proximity to the sensor trigger 206. A user rotates the second housing 192, which rotates the actuator away from the off position and moves the sensor 204 away from the sensor trigger 206, which remains stationary. The electronic circuitry 200, based on a signal from the sensor 204, determines the sensor 204 no longer detects the proximity of the sensor trigger 206 and so transmits information regarding the change of position of the actuator.

Sixth Embodiment

Figure 8A:
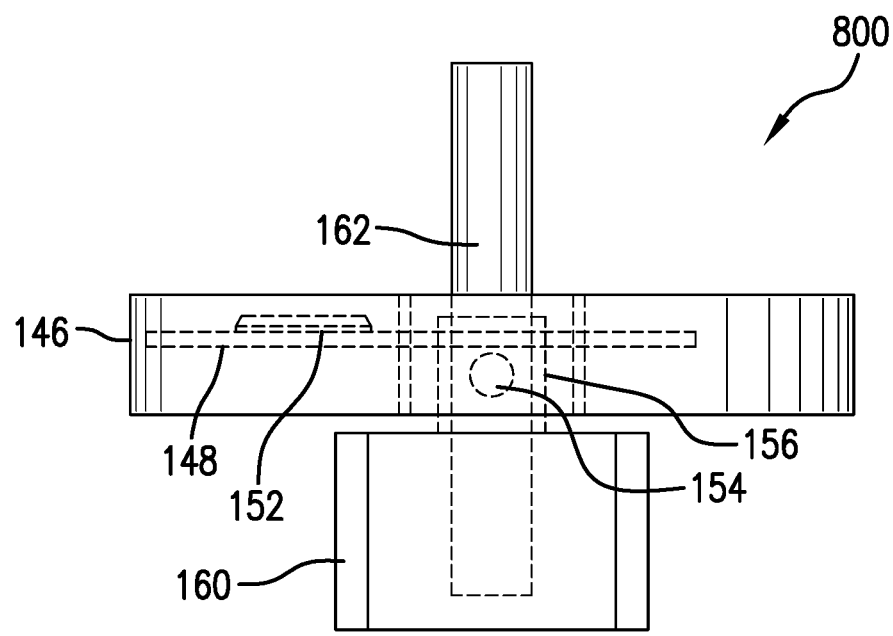
FIG. 8A is a side elevation view of a sixth embodiment wireless actuator position sensor assembly.
Figure 8B:
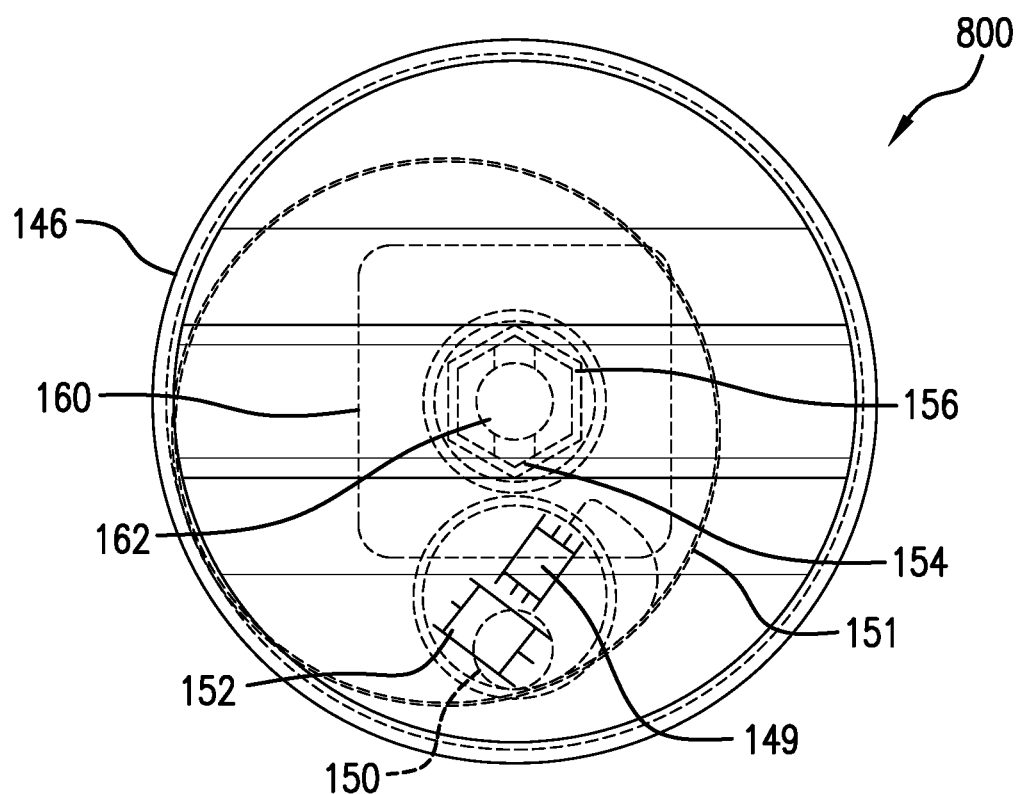
FIG. 8B is a top plan view of the sixth embodiment wireless actuator position sensor assembly.
Figure 8C:
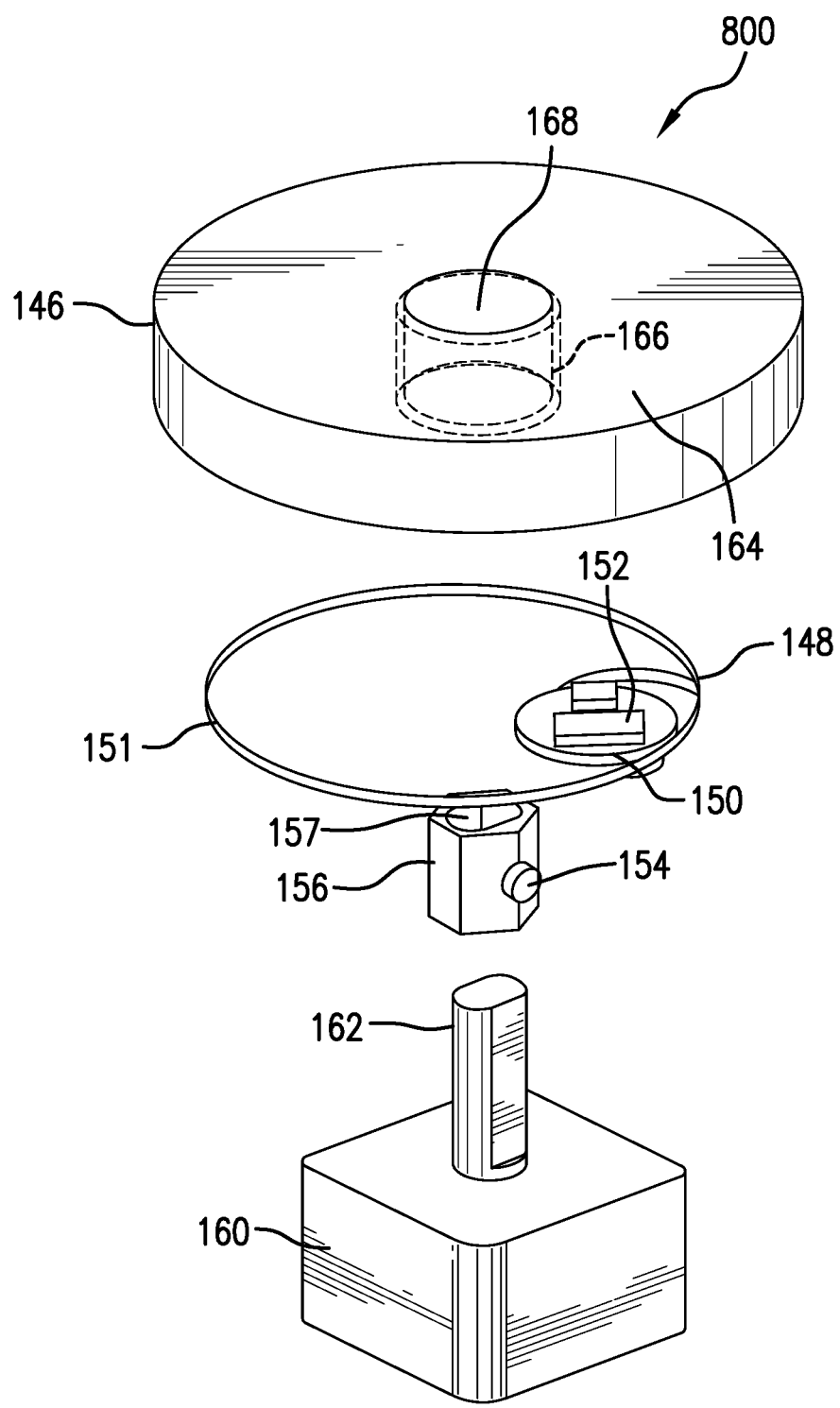
FIG. 8C is an exploded isometric view of the sixth embodiment wireless actuator position sensor assembly.

FIGS. 8A, 8B, and 8C shows a sixth embodiment wireless actuator position sensor assembly 800. The sixth embodiment 800 is similar the second embodiment 140, with the following noted differences. The sixth embodiment does not have a second housing 142 nor an adaptive sleeve 172. The second housing 142 can be omitted for actuators that have a sufficiently long actuator stem 162 that the OEM knob (not shown) can used with sufficient clearance between the first housing 146 and the OEM knob. In such instances the first housing 146, trigger sleeve 156, sensor trigger 154, and electronic circuitry 148 are installed as for the second embodiment 140. The OEM knob is placed over the first housing 146 and pushed down on the actuator stem 162. Operation of sixth embodiment 800 is similar to operation of the second embodiment 140.

Seventh Embodiment

Figure 9:
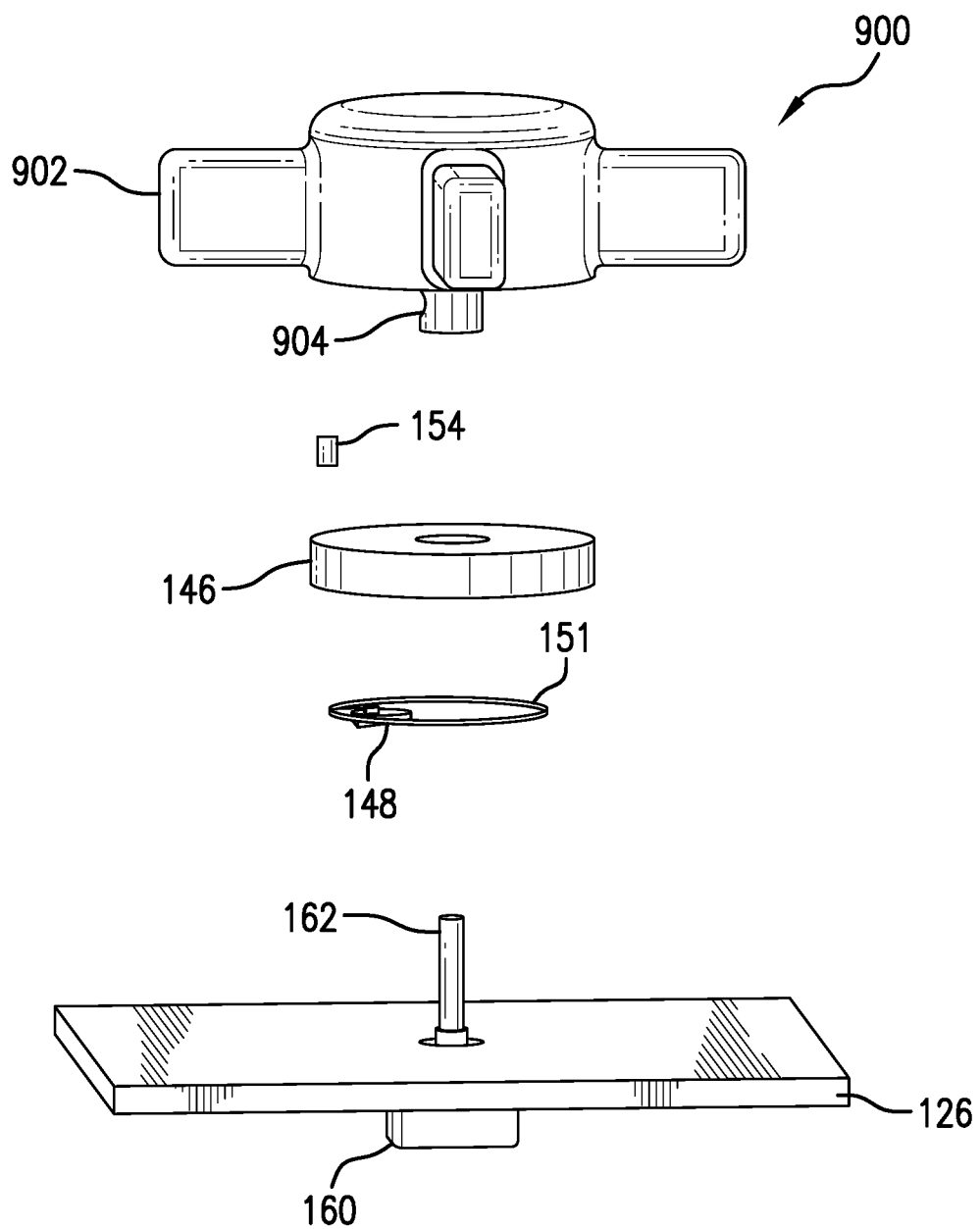
FIG. 9 is an exploded isometric view of a seventh embodiment wireless actuator position sensor assembly.

FIG. 9 shows a seventh embodiment wireless actuator position sensor assembly 900. The seventh embodiment 900 is similar to the second embodiment 140, with the following noted differences. The seventh embodiment 900 has a second housing 902 that is configured for accepting insertion of the actuator stem 162 of a particular actuator. The second housing 902 has a stem that is sufficiently long such that it will create sufficient clearance between the first housing 146 and second housing 902. The second housing 902 has a stem that includes a trigger hole 904 configured for accepting insertion of sensor trigger 154. To install the seventh embodiment 900, the first housing 146 and electronic circuitry 148 are installed as for the second embodiment 140. The sensor trigger 154 is placed into the trigger hole 904. The second housing 902 is placed over the first housing 146 and pushed down on the actuator stem 162, the stem of the second housing 902 and the sensor trigger 154 inserting into first housing stem cavity 168. Operation of seventh embodiment 900 is similar to operation of the second embodiment 140.

Eighth Embodiment

Figure 10:
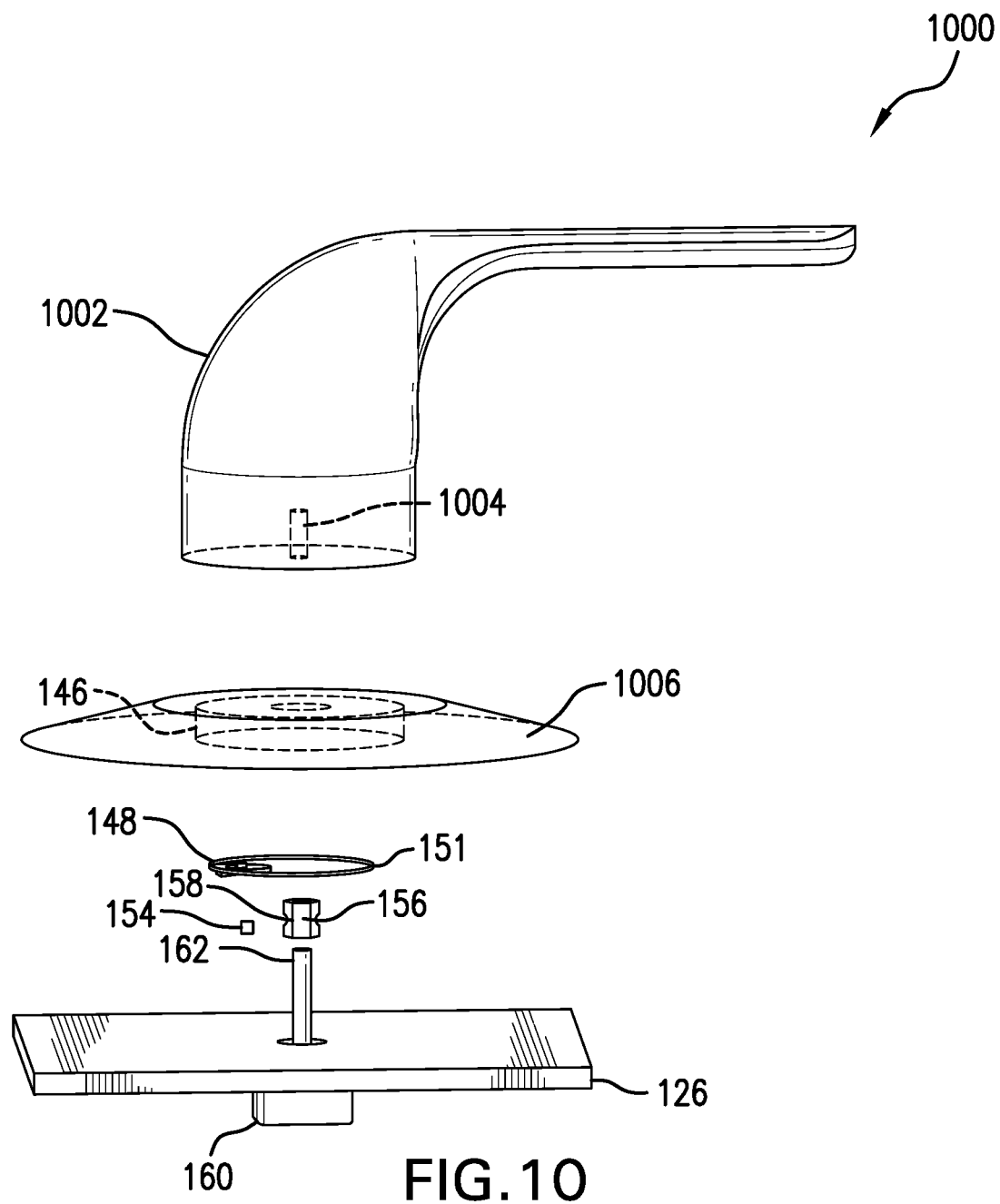
FIG. 10 is an exploded isometric view of an eighth embodiment wireless actuator position sensor assembly.

FIG. 10 shows an eighth embodiment wireless actuator position sensor assembly 1000. The eighth embodiment 1000 is similar the second embodiment 140, with the following noted differences. In the eighth embodiment 1000, the second housing 142 is replaced with a handle 1002 that is specially designed to mate with the actuator stem 162 of a particular actuator. The handle 1002 may be provided with the eighth embodiment wireless actuator position sensor assembly 1000 or it may be a pre-existing part, provided with the actuator when it was installed. The actuator has a sufficiently long actuator stem 162 such that the handle 1002 can used with sufficient clearance between the first housing 146 and the handle 1002. The eighth embodiment 1000 has a skirt 1006 that fits over the first housing 146 that functions as a splash guard to protect the electronic circuitry 148 in situations where the actuator is used in a wet environment, such as the control valve of a shower. To install the eighth embodiment 1000, the first housing 146, trigger sleeve 156, sensor trigger 154, and electronic circuitry 148 are installed as for the second embodiment 140. The handle 1002 is placed over the first housing 146 and pushed down on the actuator stem 162. Operation of eighth embodiment 1000 is similar to operation of the second embodiment 140.

What is claimed is:

1. A device for an actuator with an actuator body and an actuator stem, the actuator stem configured for changing an operational state of the actuator according to a rotational position of the actuator stem relative the actuator body, the device comprising:
    a first housing configured for securing in a fixed relation to the actuator body;
    a second housing configured for coupling to the actuator stem in a fixed relation to the actuator stem;
    an adaptive sleeve configured for coupling the second housing to the actuator stem;
    a sensor trigger;
    a set screw; and
    electronic circuitry including a sensor and a radio frequency transmitter, the sensor configured for generating a sensor output signal based on a proximity of the sensor to the sensor trigger, the radio frequency transmitter configured for transmitting information regarding a rotational position of the actuator stem based on the sensor output signal, wherein:
    the sensor and the sensor trigger are mounted in different ones of the first housing and second housing, the sensor and the sensor trigger mounted such that relative motion between the first housing and the second housing produces a change in the sensor output signal, the second housing includes a base stem with a base stem cavity configured for accepting insertion of the adaptive sleeve, and the set screw being configured for engagement with a threaded adjustment hole in the base stem, and the set screw being configured to adjust a distance between the first housing and the second housing.

2. The device of claim 1, herein the sensor is a magnetic sensor and the sensor trigger is a magnet.

3. The device of claim 1,
wherein the sensor trigger is mounted to the first housing; and
wherein the sensor is mounted to the second housing.

4. The device of claim 1,
wherein the sensor trigger is mounted to the second housing; and
wherein the sensor is mounted to the first housing.

5. The device of claim 1,
wherein the sensor is mounted to the first housing; and
further comprising a trigger sleeve configured for carrying the sensor trigger.

6. The device of claim 5,
wherein the trigger sleeve includes a trigger sleeve cavity configured for accepting insertion of the actuator stem such that the trigger sleeve rotates when the actuator stem rotates; and
wherein the trigger sleeve includes a trigger hole configured for accepting insertion of the sensor trigger.

7. The device of claim 5, wherein the first housing has a first housing stem cavity configured for accepting insertion of the trigger sleeve with a fit that is at least as loose as a sliding fit.

8. The device of claim 4, wherein the adaptive sleeve is configured for carrying the sensor trigger.

9. The device of claim 8,
wherein the adaptive sleeve includes a sleeve center cavity configured for accepting insertion of the actuator stem such that the adaptive sleeve rotates when the actuator stem rotates; and
wherein the adaptive sleeve includes a trigger hole configured for accepting insertion of the sensor trigger.

10. The device of claim 1, wherein the adaptive sleeve is integrally formed in the second housing.

11. The device of claim 1,
wherein the adaptive sleeve includes a sleeve center cavity configured for accepting insertion of the actuator stem, wherein the adaptive sleeve is configured for rotating the actuator stem when the adaptive sleeve is rotated, wherein the adaptive sleeve is configured for insertion into the second housing such that the adaptive sleeve rotates when the second housing rotates.

12. The device of claim 11,
further comprising a pin; and
wherein the adaptive sleeve has a plurality of pin holes configured for accepting insertion of the pin through a first of the pin holes through the sleeve center cavity and through a second of the pin holes.

13. The device of claim 11,
wherein the sleeve center cavity is configured with a cross-sectional shape similar to a cross-sectional shape of the actuator stem.

14. The device of claim 11,
wherein the sleeve center cavity is configured for accepting insertion of the actuator stem with a fit that is at least as tight as a sliding fit.

15. The device of claim 1, wherein the second housing further comprises:
a housing base with a base stem, the base stem with a base stem cavity, the base stem cavity with a base stem cavity top that is closed and a base stem cavity bottom that is open, the base stem configured for accepting the adaptive sleeve into the base stem such that the adaptive sleeve is rotated when the housing base is rotated; and
a housing top configured for coupling with the housing base.

16. The device of claim 15,
wherein the base stem cavity is configured for accepting insertion of the adaptive sleeve with a fit that is at least as tight as a sliding fit.

17. The device of claim 1,
wherein the adaptive sleeve has a hexagonal exterior cross-sectional shape.

18. The device of claim 1, wherein the second housing further comprises:
a mating cavity with a mating cavity top that is closed and a mating cavity bottom that is open, the mating cavity configured for accepting insertion of the adaptive sleeve such that the adaptive sleeve is rotated when the second housing rotates.

19. The device of claim 1, wherein the second housing further comprises:
a handle configured for accepting insertion of the adaptive sleeve such that the adaptive sleeve rotates when the handle rotates.

20. A device for an actuator with an actuator body and an actuator stem, the actuator stem configured for changing an operational state of the actuator according to a rotational position of the actuator stem relative the actuator body, the device comprising:
a first housing configured for securing in a fixed relation to the actuator body;
a second housing configured for coupling to the actuator stem in a fixed relation to the actuator stem;
an adaptive sleeve configured for coupling the second housing to the actuator stem;
a sensor trigger;
a trigger sleeve configured for carrying the sensor trigger, the trigger sleeve includes a trigger sleeve cavity configured for accepting insertion of the actuator stem such that the trigger sleeve rotates when the actuator stem rotates, and the trigger sleeve includes a trigger hole configured for accepting insertion of the sensor trigger; and
electronic circuitry including a sensor and a radio frequency transmitter, the sensor configured for generating a sensor output signal based on a proximity of the sensor to the sensor trigger, the radio frequency transmitter configured for transmitting information regarding the rotational position of the actuator stem based on the sensor output signal,
wherein the sensor is mounted to the first housing and the sensor trigger is mounted to the second housing, the sensor and the sensor trigger are mounted such that relative motion between the first housing and the second housing produces a change in the sensor output signal, and the trigger sleeve includes a trigger hole configured for accepting insertion of the sensor trigger.

21. A device for an actuator with an actuator body and an actuator stem, the actuator stem configured for changing an operational state of the actuator according to a rotational position of the actuator stem relative the actuator body, the device comprising:
- a first housing configured for securing in a fixed relation to the actuator body;
- a second housing configured for coupling to the actuator stem in a fixed relation to the actuator stem;
- an adaptive sleeve configured for coupling the second housing to the actuator stem;
- a sensor trigger;
- a trigger sleeve configured for carrying the sensor trigger, the trigger sleeve includes a trigger sleeve cavity configured for accepting insertion of the actuator stem such that the trigger sleeve rotates when the actuator stem rotates, and the trigger sleeve includes a trigger hole configured for accepting insertion of the sensor trigger; and
- electronic circuitry including a sensor and a radio frequency transmitter, the sensor configured for generating a sensor output signal based on a proximity of the sensor to the sensor trigger, the radio frequency transmitter configured for transmitting information regarding the rotational position of the actuator stem based on the sensor output signal, wherein the sensor is mounted to the first housing and the sensor trigger is mounted to the second housing, the sensor and the sensor trigger are mounted such that relative motion between the first housing and the second housing produces a change in the sensor output signal, and the trigger sleeve includes a trigger hole configured for accepting insertion of the sensor trigger, wherein the first housing has a first housing stem cavity configured for accepting insertion of the trigger sleeve with a fit that is at least as loose as a sliding fit, wherein the adaptive sleeve is configured for carrying the sensor trigger, wherein the adaptive sleeve includes a sleeve center cavity configured for accepting insertion of the actuator stem such that the adaptive sleeve rotates when the actuator stem rotates, and wherein the adaptive sleeve includes a trigger hole configured for accepting insertion of the sensor trigger.

* * * * *